(12) United States Patent
Kim et al.

(10) Patent No.: US 11,175,545 B2
(45) Date of Patent: Nov. 16, 2021

(54) LIQUID CRYSTAL DISPLAY

(71) Applicant: SAMSUNG DISPLAY CO., LTD., Yongin (KR)

(72) Inventors: Sung Man Kim, Seoul (KR); Jun Ho Song, Seongnam-si (KR); Tong Young Kim, Seoul (KR); Su Jin Lee, Siheung-si (KR); Yeon-Mun Jeon, Hwaseong-si (KR); Young Je Cho, Asan-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 435 days.

(21) Appl. No.: 14/564,897

(22) Filed: Dec. 9, 2014

(65) Prior Publication Data
US 2015/0160489 A1 Jun. 11, 2015

(30) Foreign Application Priority Data
Dec. 9, 2013 (KR) .......................... 10-2013-0152662

(51) Int. Cl.
*G02F 1/1362* (2006.01)
*G02F 1/1343* (2006.01)
(Continued)

(52) U.S. Cl.
CPC ...... *G02F 1/1345* (2013.01); *G02F 1/134309* (2013.01); *G02F 1/134363* (2013.01); *G02F 1/136286* (2013.01); *H01L 27/124* (2013.01); *G02F 1/13606* (2021.01); *G02F 1/13629* (2021.01); *G02F 1/134318* (2021.01);
(Continued)

(58) Field of Classification Search
None
See application file for complete search history.

(56) References Cited

U.S. PATENT DOCUMENTS 6,750,935 B2 6/2004 Seo et al.
6,992,742 B2 1/2006 Kim et al.
(Continued)

FOREIGN PATENT DOCUMENTS

CN 100390624 5/2008
CN 102789755 11/2012
(Continued)

OTHER PUBLICATIONS

European Search Report dated Apr. 23, 2015.

*Primary Examiner* — Edward J Glick
*Assistant Examiner* — Mark D Teets
(74) *Attorney, Agent, or Firm* — F. Chau & Associates, LLC

(57) ABSTRACT

A liquid crystal display according to an exemplary embodiment of the present disclosure includes: a gate line, a data line, and a compensation voltage line disposed on an insulation substrate; a first passivation layer disposed on the gate line, the data line, and the compensation voltage line; a pixel electrode connected to the gate line and the data line, and a compensation electrode connected to the compensation voltage line, disposed on the first passivation layer; and a common electrode formed on the first passivation layer, wherein the compensation electrode overlaps at least a portion of the data line, and the compensation voltage line is formed with the same layer as the data line.

18 Claims, 39 Drawing Sheets

(51) Int. Cl.
  *H01L 27/12* (2006.01)
  *G02F 1/136* (2006.01)
  *G02F 1/1345* (2006.01)
  *G09G 3/36* (2006.01)
(52) U.S. Cl.
  CPC .. *G02F 1/134336* (2013.01); *G02F 1/136218* (2021.01); *G09G 3/3648* (2013.01); *G09G 2300/043* (2013.01); *G09G 2300/0434* (2013.01); *G09G 2300/0876* (2013.01)

(56) References Cited

U.S. PATENT DOCUMENTS

| | | |
|---|---|---|
| 7,405,427 B2 | 7/2008 | Lee et al. |
| 7,443,477 B2 | 10/2008 | Lin et al. |
| 7,837,970 B2 | 11/2010 | Daum |
| 8,009,256 B2 | 8/2011 | Yun et al. |
| 8,169,579 B2 | 5/2012 | Kim |
| 8,189,155 B2 | 5/2012 | Chan et al. |
| 8,212,984 B2 | 7/2012 | Kim et al. |
| 8,305,507 B2 | 11/2012 | Ryu et al. |
| 2002/0131003 A1 | 9/2002 | Matsumoto |
| 2003/0095222 A1 | 5/2003 | Wang |
| 2003/0133066 A1 | 7/2003 | Ono et al. |
| 2004/0189917 A1 | 9/2004 | Tanaka et al. |
| 2005/0030461 A1 | 2/2005 | Ono et al. |
| 2005/0231675 A1 | 10/2005 | Chen et al. |
| 2006/0138419 A1* | 6/2006 | Lee ............... G02F 1/136227 257/59 |
| 2009/0207366 A1 | 8/2009 | Kim |
| 2011/0221983 A1 | 9/2011 | Lee |
| 2013/0038830 A1* | 2/2013 | Sato ............... G02F 1/134309 349/149 |
| 2013/0314658 A1* | 11/2013 | Park ............... G02F 1/134363 349/147 |
| 2013/0321736 A1* | 12/2013 | Jang ............... G02F 1/136286 349/46 |
| 2014/0071387 A1* | 3/2014 | Sakai ............... G02F 1/136209 349/110 |

FOREIGN PATENT DOCUMENTS

| | | |
|---|---|---|
| CN | 103018983 | 4/2013 |
| JP | 4176487 | 8/2008 |
| JP | 4720970 | 4/2011 |
| JP | 2013-190704 | 9/2013 |
| KR | 10-2007-0107370 | 11/2007 |
| KR | 10-2008-0001957 | 1/2008 |
| KR | 10-2008-0030877 | 4/2008 |
| KR | 10-2008-0054228 | 6/2008 |
| KR | 10-2009-0005817 | 1/2009 |
| KR | 10-2009-0049659 | 5/2009 |
| KR | 10-2009-0090708 | 8/2009 |
| KR | 1020090089098 | 8/2009 |
| KR | 10-2010-0006781 | 1/2010 |
| KR | 10-0955382 | 4/2010 |
| KR | 10-2010-0054344 | 5/2010 |
| KR | 10-2012-0110888 | 10/2012 |
| KR | 10-2012-0116651 | 10/2012 |
| KR | 10-2012-0119299 | 10/2012 |
| KR | 10-1189144 | 10/2012 |
| KR | 10-1200878 | 11/2012 |
| KR | 1020130031559 | 3/2013 |
| KR | 1020130130998 | 12/2013 |
| KR | 10-2014-0102983 | 8/2014 |
| TW | 200809722 | 2/2008 |
| WO | WO 2012/165221 | 12/2012 |

* cited by examiner

LIQUID CRYSTAL DISPLAY

CROSS-REFERENCE TO RELATED APPLICATION

This application claims priority from Korean Patent Application No. 10-2013-0152662 filed in the Korean Intellectual Property Office on Dec. 9, 2013, and all the benefits accruing therefrom, the contents of which are herein incorporated by reference in their entirety.

BACKGROUND (a) Technical Field

The present disclosure relates to a liquid crystal display.

(b) Discussion of the Related Art

Liquid crystal displays (LCDs) are among the most widely used flat panel displays, and they display images by applying voltages to field-generating electrodes to generate an electric field in an LC layer that determines orientations of LC molecules therein to adjust polarization of incident light.

Liquid crystal displays are lightweight and thin, but have lower lateral visibility than front visibility, and various liquid crystal arrangements and driving methods have been developed to address this phenomena. To realize a wider viewing angle, liquid crystal displays with a pixel electrode and a reference or common electrode on one substrate have been studied.

In a liquid crystal display of this form, at least one of the two field generating electrodes, i.e. the pixel electrode and the common electrode, has a plurality of cutouts and a plurality of branch electrodes defined by the plurality of cutouts.

Different photomasks are required to form two field generating electrodes on one display panel, which increases the manufacturing cost.

In addition, when connecting the common electrodes, which are applied with a constant voltage, the data line and the common electrode overlap each other and couple such that a ripple of the common voltage may be generated.

The common voltage ripple can deteriorate display quality due to, e.g., flickering.

SUMMARY

Embodiments of the present disclosure provide a liquid crystal display that can prevent an increase of a manufacturing cost and can prevent a common voltage ripple generated by coupling between a data line and a common electrode when forming two field generating electrodes on one display panel.

A liquid crystal display according to an exemplary embodiment of the present disclosure includes: a gate line, a data line, and a compensation voltage line disposed on an insulation substrate; a first passivation layer disposed on the gate line, the data line, and the compensation voltage line; a pixel electrode connected to the gate line and the data line, and a compensation electrode connected to the compensation voltage line, disposed on the first passivation layer; and a common electrode disposed on the first passivation layer, wherein the compensation electrode overlaps at least a portion of the data line, and the compensation voltage line may be formed from a same layer as the data line.

The compensation voltage line may extend parallel to the data line.

The compensation voltage line may be positioned between two adjacent data lines.

The data line may include a plurality of data lines, and the compensation electrode may overlap at least some of the plurality of data lines.

The common electrode may overlap the data line, and the common electrode may overlap the compensation electrode.

The common electrode may have a cutout disposed at a position that overlaps the data line.

The liquid crystal display may further include a second passivation layer disposed on the pixel electrode and the compensation electrode and under the common electrode.

The common electrode may have a first cutout, the second passivation layer may have a second cutout, and an edge of the first cutout may overlap an edge of the second cutout.

The liquid crystal display may further include a second passivation layer disposed on the common electrode and under the pixel electrode and the compensation electrode.

The pixel electrode and the compensation electrode may be formed from a same layer.

A liquid crystal display according to another exemplary embodiment of the present disclosure includes: a gate line, a data line, and a compensation voltage line disposed on an insulation substrate; a first passivation layer disposed on the gate line, the data line, and the compensation voltage line; a pixel electrode connected to the gate line and the data line, and a compensation electrode connected to the compensation voltage line, disposed on the first passivation layer; and a common electrode disposed on the first passivation layer, wherein the compensation electrode overlaps at least a portion of the data line, and the compensation voltage line may be formed from a same layer as the gate line.

The compensation voltage line may extend parallel to the gate line.

A liquid crystal display according to another exemplary embodiment of the present disclosure includes: a gate line, a data line, and a compensation voltage line disposed on an insulation substrate; a first passivation layer disposed on the gate line, the data line, and the compensation voltage line; a pixel electrode connected to the gate line and the data line, and a compensation electrode connected to the compensation voltage line, disposed on the first passivation layer; and a common electrode disposed on the first passivation layer, wherein the compensation electrode overlaps at least a portion of the data line, and the compensation voltage line may extend parallel to the gate line.

According to a liquid crystal display according to an exemplary embodiment of the present disclosure, when forming two field generating electrodes on one display panel, a common voltage ripple generated by the coupling between the data line and the common electrode can be prevented and the manufacturing cost may be reduced.

DETAILED DESCRIPTION OF EXEMPLARY EMBODIMENTS

Figure 1:
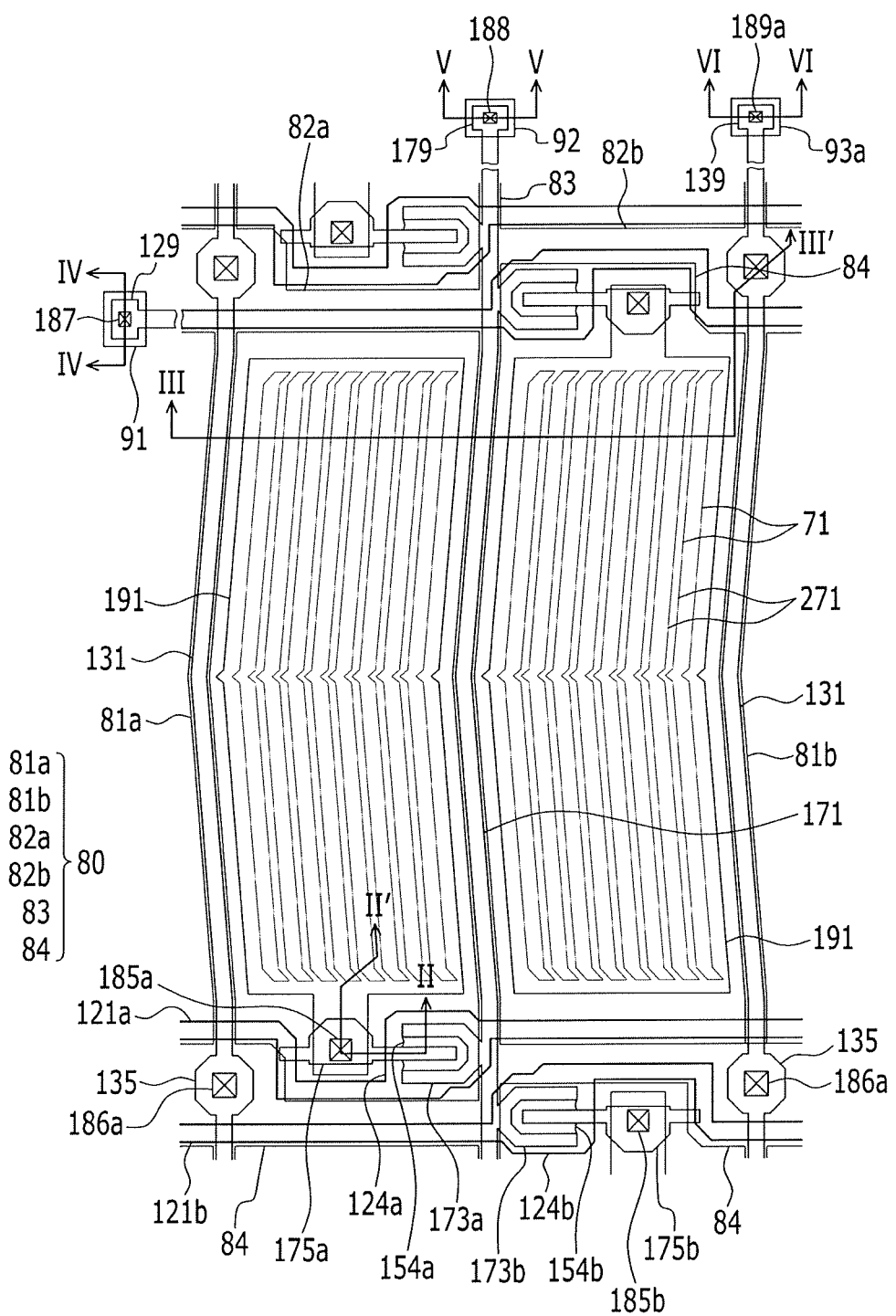
FIG. 1 is a layout view of a liquid crystal display according to an exemplary embodiment of the present disclosure.

Embodiments of the present disclosure will be described more fully hereinafter with reference to the accompanying drawings, in which exemplary embodiments of the disclosure are shown. As those skilled in the art would realize, the described embodiments may be modified in various different ways, all without departing from the spirit or scope of the present disclosure.

In the drawings, the thickness of layers, films, panels, regions, etc., may be exaggerated for clarity. Like reference numerals may designate like elements throughout the specification. It will be understood that when an element such as a layer, film, region, or substrate is referred to as being "on" another element, it can be directly on the other element or intervening elements may also be present.

Now, an exemplary embodiment of the present disclosure will be described with reference to accompanying drawings.

Figure 2:
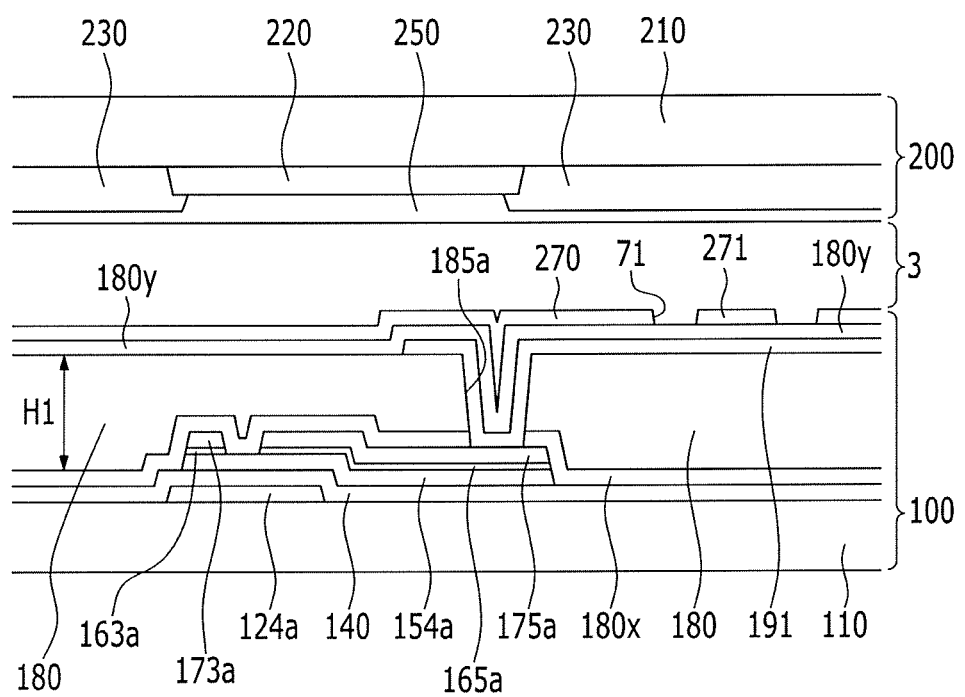
FIG. 2 is a cross-sectional view of the liquid crystal display of FIG. 1 taken along line II-II'.
Figure 3:
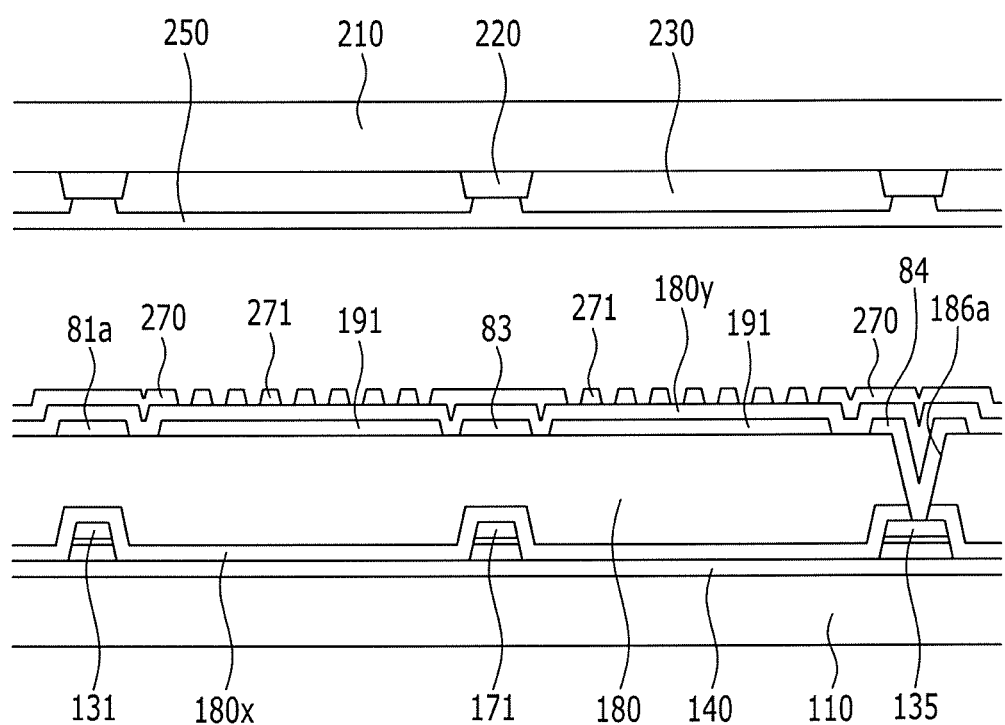
FIG. 3 is a cross-sectional view of the liquid crystal display of FIG. 1 taken along line III-III'.
Figure 4:
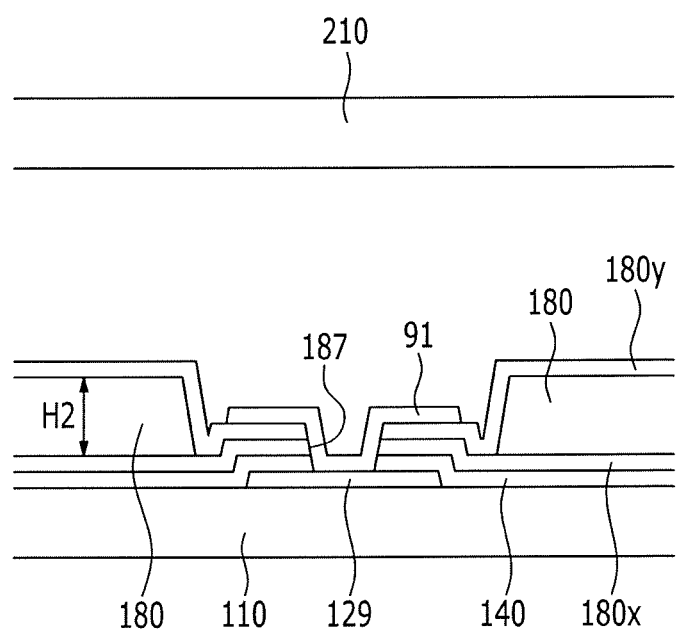
FIG. 4 is a cross-sectional view of the liquid crystal display of FIG. 1 taken along line IV-IV.
Figure 5:
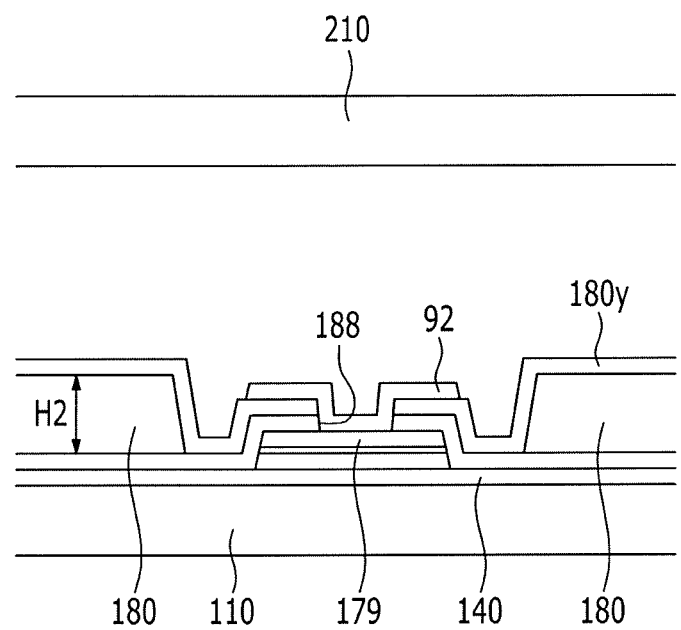
FIG. 5 is a cross-sectional view of the liquid crystal display of FIG. 1 taken along line V-V.
Figure 6:
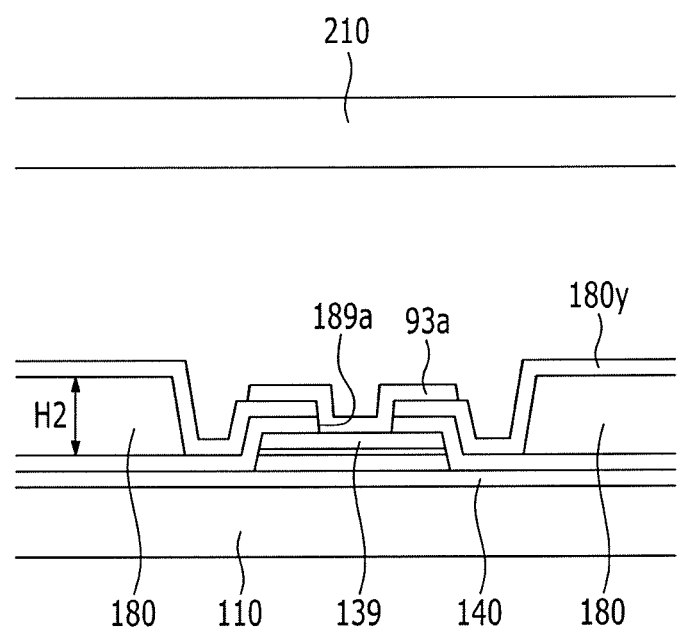
FIG. 6 is a cross-sectional view of the liquid crystal display of FIG. 1 taken along line VI-VI.

First, a liquid crystal display according to an exemplary embodiment of the present disclosure will be described with reference to FIG. 1 to FIG. 6. FIG. 1 is a layout view of a liquid crystal display according to an exemplary embodiment of the present disclosure. FIG. 2 is a cross-sectional view of the liquid crystal display of FIG. 1 taken along line II-II'. FIG. 3 is a cross-sectional view of the liquid crystal display of FIG. 1 taken along line III-III'. FIG. 4 is a cross-sectional view of the liquid crystal display of FIG. 1 taken along line IV-IV. FIG. 5 is a cross-sectional view of the liquid crystal display of FIG. 1 taken along line V-V. FIG. 6 is a cross-sectional view of the liquid crystal display of FIG. 1 taken along line VI-VI.

Referring to FIG. 1 to FIG. 6, a liquid crystal display according to an exemplary embodiment of the present disclosure includes a lower panel 100 and an upper panel 200 facing each other, and a liquid crystal layer 3 interposed therebetween.

Firstly, the lower panel 100 will be described.

A plurality of first and second gate lines 121a and 121b are disposed on a first insulation substrate 110 made of transparent glass or plastic.

The first gate line 121a and the second gate line 121b are disposed in pairs between pixel rows.

The first gate line 121a includes a first gate electrode 124a, and the second gate line 121b includes a second gate electrode 124b. Each of the gate lines 121a and 121b includes a wide gate pad portion 129 for connection with another layer or an external driving circuit.

A gate insulating layer 140 is disposed on the plurality of gate lines 121a and 121b.

A first semiconductor 154a and a second semiconductor 154b are disposed on the gate insulating layer 140. The semiconductors 154a and 154b may include an oxide semiconductor.

Ohmic contacts 163a and 165a are disposed on the semiconductors 154a and 154b. If the semiconductors 154a and 154b include an oxide semiconductor, the ohmic contacts 163a and 165a may be omitted.

A plurality of data lines 171, a plurality of drain electrodes 175a and 175b, and a plurality of compensation voltage lines 131 are disposed on the ohmic contacts 163a and 165a.

The data line 171 transmits a data signal and extends in a substantially longitudinal direction thereby intersecting the gate lines 121a and 121b. One data line 171 is associated with two columns of pixels.

The data line 171 may have a first curved portion with a curved shape to maximize transmittance of the liquid crystal display, and the first curved portion may meet a second curved portion which forms a predetermined angle with the first curved portion at a "V" shape in a middle region of the pixel area.

Each data line 171 includes a first source electrode 173a that extends toward the first gate electrode 124a and a second source electrode 173b that extends toward the second gate electrode 124b.

Each data line 171 includes a wide data pad portion 179 for connection with another layer or an external driving circuit.

The first drain electrode 175a includes one end facing the first source electrode 173a and a wide other end, and forms a thin film transistor (TFT) along with the first gate electrode 124a and the first semiconductor 154a.

The second drain electrode 175b includes one end facing the second source electrode 173b and a wide other end, and forms a thin film transistor (TFT) along with the second gate electrode 124b and the second semiconductor 154b.

The compensation voltage line 131 extends parallel to the data line 171, and one compensation voltage line 131 may be associated with two pixel columns. The data line 171 and the compensation voltage line 131 may be alternately disposed.

The compensation voltage line 131 includes a plurality of extensions 135 and includes a wide compensation pad portion 139 for connection with another layer or an external driving circuit.

A first passivation layer 180x is disposed on the plurality of data lines 171, the plurality of drain electrodes 175a and 175b, and the plurality of compensation voltage lines 131. The first passivation layer 180x may be made of an organic insulating material or an inorganic insulating material.

An organic layer 180 is disposed on the first passivation layer 180x. The organic layer 180 may have be thicker than the first passivation layer 180x and may have a flat surface.

In a liquid crystal display according to another exemplary embodiment of the present disclosure, the organic layer 180 may be omitted. In a liquid crystal display according to another exemplary embodiment of the present disclosure, the organic layer 180 may be a color filter, and in this case, a layer disposed on the organic layer 180 may be further included. For example, an overcoat or capping layer may be disposed on the color filter to prevent a color pigment from flowing into the liquid crystal layer, and the overcoat may be made of an insulating material such as a silicon nitride (SiNx).

The organic layer 180 may be positioned in a display area in which a plurality of pixels are positioned, and may not be positioned in a peripheral area in which the gate pad portion 129, the data pad portion 179, and the compensation pad portion 139 are positioned.

A first height H1 of the organic layer 180 in the display area is greater than a second height H2 of the organic layer 180 near the gate pad portion 129, the data pad portion 179, and the compensation pad portion 139.

The organic layer 180 and the first passivation layer 180x are penetrated by a first contact hole 185a that exposes the first drain electrode 175a, a second contact hole 185b that exposes the second drain electrode 175b, and a third contact hole 186a that exposes the extension 135 of the compensation voltage line 131.

A pixel electrode 191 and a compensation electrode 80 are disposed on the organic layer 180.

The pixel electrode 191 includes curved edges which are substantially parallel to the first curved portion and the second curved portion of the data line 171. The pixel electrode 191 is made of a transparent conductive layer such as ITO or IZO.

The pixel electrode 191 is positioned at both sides of the data line 171, and is connected to the first drain electrode 175a through the first contact hole 185a and the second drain electrode 175b through the second contact hole 185b.

The compensation electrode 80 includes a first longitudinal portion 81a, a second longitudinal portion 81b, a first transverse portion 82a, a second transverse portion 82b, and a shielding electrode 83. The first longitudinal portion 81a and the second longitudinal portion 81b overlap and extend parallel to the two compensation voltage lines 131 positioned at either side of the data line 171. The first transverse portion 82a extends from the first longitudinal portion 81a parallel to the direction of the gate lines 121a and 121b and the second transverse portion 82b extends from the second longitudinal portion 81b parallel to the direction of the gate lines 121a and 121b. The shielding electrode 83 is connected to the first transverse portion 82a and the second transverse portion 82b that overlap and are parallel to the data line 171.

The first longitudinal portion 81a and the second longitudinal portion 81b of the compensation electrode 80 include a plurality of first connections 84 that overlap the extension 135 of the compensation voltage line 131.

The first connection 84 of the compensation electrode 80 is connected to the compensation voltage line 131 through the third contact hole 186a.

The pixel electrode 191 and the compensation electrode 80 may be simultaneously formed from the same layer.

A second passivation layer 180y is disposed on the pixel electrode 191 and the compensation electrode 80.

The second passivation layer 180y, the first passivation layer 180x, and the gate insulating layer 140 have a fourth contact hole 187 in a region positioned at the gate pad portion 129 where they do not overlap the organic layer 180 that exposes the gate pad portion 129. Similarly, the second passivation layer 180y and the first passivation layer 180x have a fifth contact hole 188 in a region positioned at the data pad portion 179 where they do not overlap the organic layer that exposes the data pad portion 179, and the second passivation layer 180y and the first passivation layer 180x have a sixth contact hole 189a in a region positioned at the compensation pad portion 139 where they do not overlap the organic layer 180 that exposes the compensation pad portion 139.

A common electrode 270, a first contact assistant 91, a second contact assistant 92, and a third contact assistant 93a are disposed on the second passivation layer 180y.

The common electrode 270 has a plurality of first cutouts 71 in the pixel area, and a plurality of first branch electrodes 271 defined by the plurality of first cutouts 71. The plurality of first branch electrodes 271 overlap the pixel electrode 191. The plurality of first branch electrodes 271 extend substantially parallel to the data line 171.

The first contact assistant 91 is positioned on the gate pad portion 129 exposed through the fourth contact hole, the second contact assistant 92 is positioned on the data pad portion 179 exposed through the fifth contact hole 188, and the third contact assistant 93a is positioned on the compensation pad portion 139 exposed through the sixth contact hole 189a.

The common electrode 270, the first contact assistant 91, the second contact assistant 92, and the third contact assistant 93a are formed from a transparent conductive layer such as ITO or IZO.

In addition, a horizontal first alignment layer that is rubbed in a predetermined direction may be disposed on the second passivation layer 180y and the common electrode 270. However, in a liquid crystal display according to another exemplary embodiment of the present disclosure, the first alignment layer may include a photoreactive material to be photo-aligned.

Now, the upper display panel 200 will be described.

A light blocking member 220 is disposed on a second insulating substrate 210 that is made of transparent glass, plastic, etc. The light blocking member 220 is also called a black matrix and prevents light leakage.

A plurality of color filters 230 are also disposed on the second substrate 210.

An overcoat 250 is disposed on the color filter 230 and the light blocking member 220. The overcoat 250 is made of an organic insulator, prevents exposure of the color filter 230, and provides a flat surface. The overcoat 250 may be omitted.

In addition, a horizontal second alignment layer that is rubbed in a predetermined direction may be disposed on the overcoat 250. However, in a liquid crystal display according to another exemplary embodiment of the present disclosure, the second alignment layer may include a photoreactive material to be photo-aligned.

The liquid crystal layer 3 includes a plurality of liquid crystal molecules positioned on the pixel electrode 191 and common electrode 270 that are arranged such that long axis direction thereof is aligned parallel to the display panels 100 and 200.

The pixel electrode 191 receives a data voltage from the drain electrodes 175a and 175b, and the common electrode 270 receives a common voltage having a predetermined magnitude from a common voltage applying unit disposed outside the display region.

The pixel electrode 191 and the common electrode 270 are field generating electrodes that generate an electric field that rotates the liquid crystal molecules of the liquid crystal layer 3 in a direction parallel with a direction of the electric field. The polarization of light passing through the liquid crystal layer 3 changes according to the rotation direction of the liquid crystal molecules as described above.

In a liquid crystal display according to an exemplary embodiment shown in FIG. 1 to FIG. 6, the organic layer 180 is positioned on the first passivation layer 180x of the lower panel 100, and the color filter 230 and the light blocking member 220 are positioned on the upper panel 200. However, in a case of a liquid crystal display according to another exemplary embodiment of the present disclosure, the color filter 230 may replace the organic layer 180 on the lower panel 100 and the color filter 230 may be omitted from the upper panel 200. In this case, the light blocking member 220 may also be positioned on the lower panel 100 instead of the upper panel 200.

Figure 7:
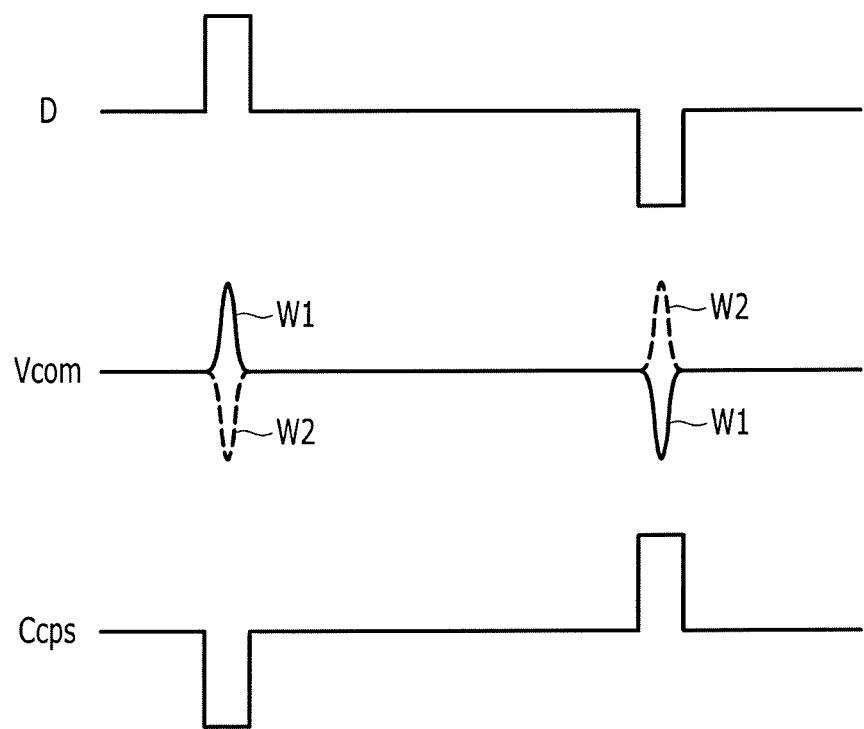
FIG. 7 is a waveform diagram of partial signals applied to a liquid crystal display according to an exemplary embodiment of the present disclosure.

Next, signals applied to a liquid crystal display according to an exemplary embodiment of the present disclosure will be described with reference to FIG. 7. FIG. 7 is a waveform diagram of partial signals applied to a liquid crystal display according to an exemplary embodiment of the present disclosure.

The data line 171 and the common electrode 270 overlap each other such that a ripple of the common voltage may be generated by a coupling of the voltages applied to the data line 171 and the common electrode 270. To compensate the common voltage ripple, the compensation electrode 80, which includes the shielding electrode 83 overlapping the data line 171, is applied with a voltage of a polarity opposite to the common voltage ripple, to prevent the ripple from being generated by the coupling between the data line 171 and the common electrode 270.

This will be described with reference to FIG. 7.

Referring to FIG. 7, the data line 171 and the common electrode 270 overlap each other, thereby forming a first capacitor C1. Accordingly, by the coupling with the data voltage D applied to the data line 171, the common voltage Vcom applied to the common electrode 270 may change by a first magnitude W1. At this time, a compensation voltage Ccps applied to the compensation electrode 80 has the opposite polarity to that of the data voltage D applied to the data line 171.

The shielding electrode 83 of the compensation electrode 80, which overlaps the data line 171, also overlaps the common electrode 270, thereby forming a second capacitor C2. Accordingly, by the coupling between the shielding electrode 83 and the common electrode 270, the common voltage Vcom applied to the common electrode 270 may change by a second magnitude W2. That is, by applying a voltage having a polarity opposite to the data voltage D to the compensation electrode 80, the first magnitude W1 change of the common voltage Vcom due to the data voltage D is compensated by the coupling due to the compensation voltage Ccps of the compensation electrode 80, thereby maintaining a uniform common voltage magnitude Vcom applied to the common electrode 270.

Figure 8:
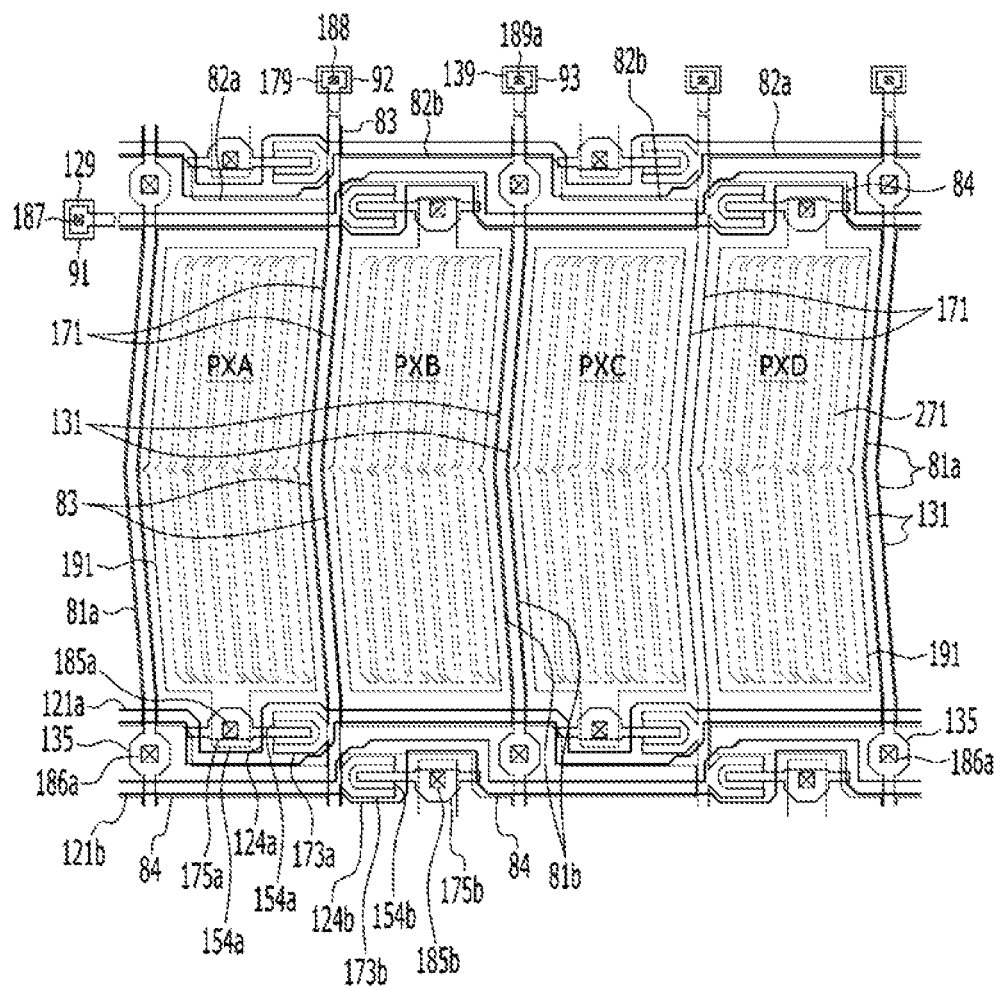
FIG. 8 is a layout view of a liquid crystal display according to another exemplary embodiment of the present disclosure.

Next, an arrangement of the compensation electrode 80 of a liquid crystal display according to another exemplary embodiment of the present disclosure will be described with reference to FIG. 8. FIG. 8 is a layout view of a liquid crystal display according to another exemplary embodiment of the present disclosure.

Referring to FIG. 8, the compensation electrode 80 of a liquid crystal display according to a current exemplary embodiment of the present disclosure includes the shielding electrode 83 that overlaps some of the plurality of data lines 171. For example, the shielding electrode 83 overlaps the data line 171 positioned between the first pixel PXA and the second pixel PXB of four adjacent pixels PXA, PXB, PXC, and PXD, but does not overlap the data line 171 positioned between the third pixel PXC and the fourth pixel PXD.

Many features of a liquid crystal display according to an exemplary embodiment described with reference to FIG. 1 to FIG. 6 and FIG. 7 may be applied to the liquid crystal display according to a present exemplary embodiment of FIG. 8.

Figure 9:
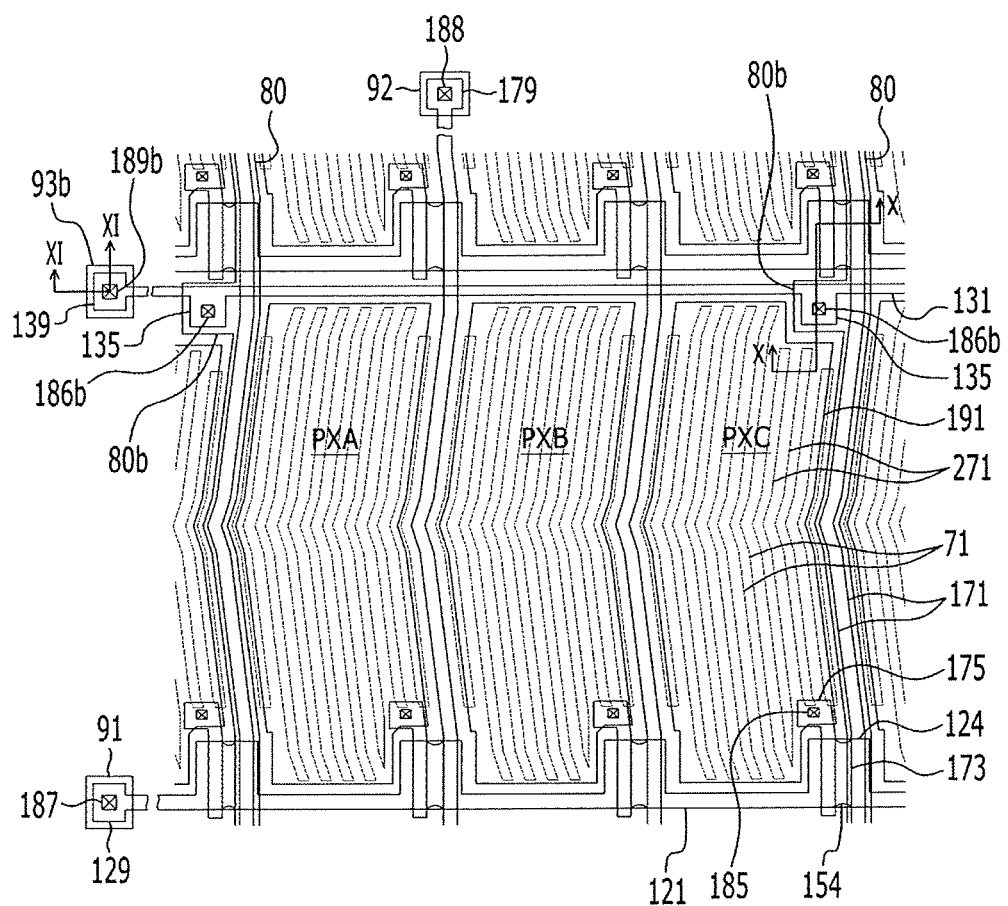
FIG. 9 is a layout view of a liquid crystal display according to another exemplary embodiment of the present disclosure.
Figure 10:
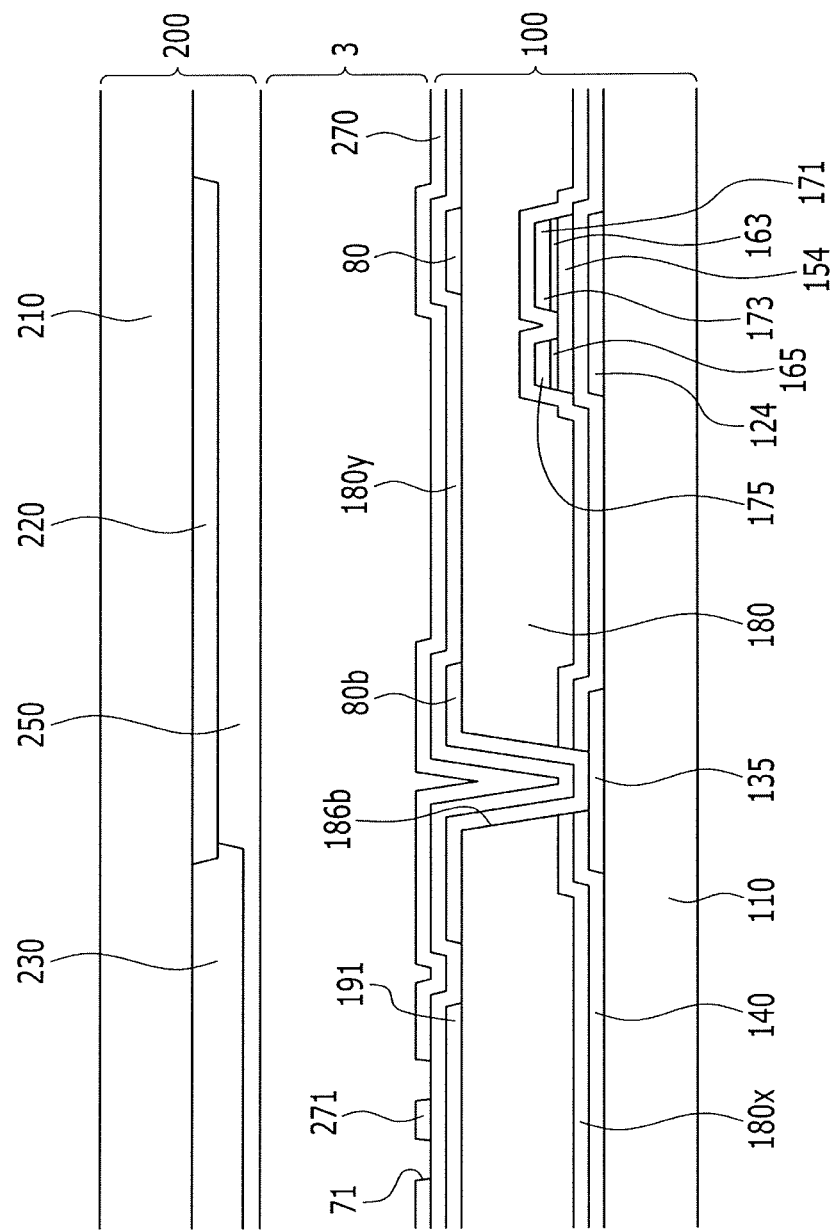
FIG. 10 is a cross-sectional view of the liquid crystal display of FIG. 9 taken along line X-X.
Figure 11:
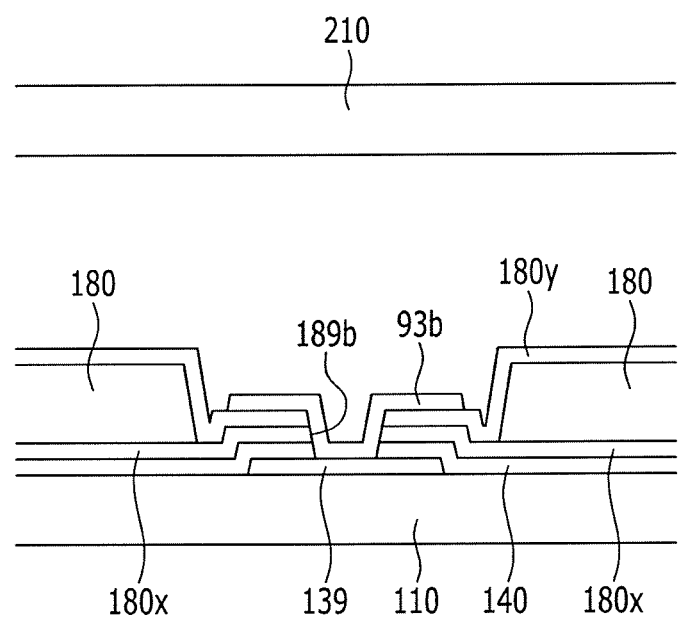
FIG. 11 is a cross-sectional view of the liquid crystal display of FIG. 9 taken along line XI-XI.

Next, a liquid crystal display according to another exemplary embodiment of the present disclosure will be described with reference to FIG. 9 to FIG. 11. FIG. 9 is a layout view of a liquid crystal display according to another exemplary embodiment of the present disclosure. FIG. 10 is a cross-sectional view of the liquid crystal display of FIG. 9 taken along line X-X. FIG. 11 is a cross-sectional view of the liquid crystal display of FIG. 9 taken along line XI-XI.

Referring to FIG. 9 to FIG. 11, a liquid crystal display according to a present exemplary embodiment includes the lower panel 100 and the upper panel 200 facing each other and the liquid crystal layer 3 interposed therebetween.

First, the lower panel 100 will be described.

A gate line 121 and a compensation voltage line 131 are disposed on a first insulation substrate 110 made of a transparent glass or plastic. The gate line 121 and the compensation voltage line 131 are formed together from the same layer.

The gate line 121 includes the gate electrode 124 and the gate pad portion 129.

The compensation voltage line 131 extends parallel to the gate line 121 and includes a plurality of extensions 135 and the compensation pad portion 139.

A gate insulating layer 140 is disposed on the gate line 121 and the compensation voltage line 131.

A semiconductor 154 is disposed on the gate insulating layer 140.

Ohmic contacts 163 and 165 are disposed on the semiconductor 154. The ohmic contacts 163 and 165 may be disposed in a pair on the semiconductor 154. If the semiconductor 154 is an oxide semiconductor, the ohmic contacts 163 and 165 may be omitted.

A data conductor that includes a data line 171, a source electrode 173 and a drain electrode 175 is disposed on the ohmic contacts 163 and 165 and the gate insulating layer 140.

The data line 171 includes a wide end for connection with other layers or an external driving circuit. The data line 171 transmits a data signal and extends in a substantially longitudinal direction thereby intersecting the gate line 121.

In addition, the data line 171 may have a first curved portion with a curved shape to maximize transmittance of the liquid crystal display, and the first curved portion may meet a second curved portion at a center region of the pixel area thereby forming a "V" shape.

The source electrode 173 is a portion of the data line 171. The drain electrode 175 may be disposed parallel to the source electrode 173. Accordingly, the drain electrode 175 is parallel to the portion of the data line 171.

The gate electrode 124, the source electrode 173, and the drain electrode 175 form a thin film transistor (TFT) along with the semiconductor 154, and a channel of the thin film transistor forms in the semiconductor 154 between the source electrode 173 and the drain electrode 175.

A liquid crystal display according to a present exemplary embodiment includes the source electrode 173 positioned on the same line as the data line 171 and the drain electrode 175 extending parallel to the data line 171 such that the width of the thin film transistor may increase without increasing the area occupied by the data conductor, thereby increasing the aperture ratio of the liquid crystal display.

However, in a liquid crystal display according to another exemplary embodiment of the present disclosure, the source electrode 173 and the drain electrode 175 have different shapes.

A first passivation layer 180x is disposed on the data conductor 171, 173, and 175, the gate insulating layer 140, and the portion of the semiconductor 154 exposed between the source electrode 173 and the drain electrode 175. The first passivation layer 180x may be made of an organic insulating material or an inorganic insulating material.

An organic layer 180 is disposed on the first passivation layer 180x. The organic layer 180 is thicker than the first passivation layer 180x and may have a flat surface.

The organic layer 180 may be positioned in the display area where a plurality of pixels are positioned, and may not be positioned in the peripheral area where the gate pad portion and the data pad portion are positioned. Alternatively, the organic layer 180 may be positioned in the peripheral area where the gate pad portion or the data pad portion are positioned, where the organic layer 180 may have a lower surface height than the organic layer 180 positioned at the display area.

The organic layer 180 and the first passivation layer 180x have a seventh contact hole 185 that exposes the drain electrode 175.

The organic layer 180, the first passivation layer 180x, and the gate insulating layer 140 have an eighth contact hole 186b that exposes the compensation voltage line 131.

A pixel electrode 191 and a compensation electrode 80 are disposed on the organic layer 180. The compensation electrode 80 overlaps the data line 171 and extends along with the data line 171. The compensation electrode 80 includes a second connection 80b that extends toward the extension 135 of the compensation voltage line 131.

The second connection 80b of the compensation electrode 80 is connected to the compensation voltage line 131 through the eighth contact hole 186b.

The pixel electrode 191 and the compensation electrode 80 may be simultaneously formed from the same layer.

A second passivation layer 180y is disposed on the pixel electrode 191 and the compensation electrode 80.

The second passivation layer 180y, the first passivation layer 180x, and the gate insulating layer 140 have a fourth contact hole 187 in a region positioned at the gate pad portion where they do not overlap the organic layer 180 that exposes the gate pad portion 129. Similarly, the second passivation layer 180y and the first passivation layer 180x have a fifth contact hole 188 in a region positioned at the data pad portion 179 where they do not overlap the organic layer 180 that exposes the data pad portion 179.

Referring to FIG. 11, the first passivation layer 180x, the second passivation layer 180y, and the gate insulating layer 140 have a ninth contact hole 189b in a region positioned at the compensation pad portion where they do not overlap the organic layer 180 that exposes the compensation pad portion 139.

A common electrode 270, a first contact assistant 91, a second contact assistant 92, and a fourth contact assistant 93b are disposed on the second passivation layer 180y.

The common electrode 270 includes a plurality of first cutouts 71 and a plurality of first branch electrodes 271 defined by the plurality of first cutouts 71. A plurality of first branch electrodes 271 overlap the pixel electrode 191. A plurality of first branch electrodes 271 extend substantially parallel to the data line 171.

The first contact assistant 91 is disposed on the gate pad portion 129 exposed through the fourth contact hole 187, and the second contact assistant 92 is disposed on the data pad portion 179 exposed through the fifth contact hole. In addition, the fourth contact assistant 93b is disposed on the compensation pad portion 139 exposed through the ninth contact hole 189b.

The common electrode 270, the first contact assistant 91, the second contact assistant 92, and the fourth contact assistant 93b are formed from a transparent conductive layer such as ITO or IZO.

Next, the upper panel 200 will be described.

A light blocking member 220 and a color filter 230 are disposed on the second insulation substrate 210, and an overcoat 250 is disposed on the color filter 230 and the light blocking member 220.

As shown in FIG. 9, according to a liquid crystal display of a present exemplary embodiment, the compensation electrode 80 overlaps some, but not all data lines 171. However, according to a liquid crystal display of a current exemplary embodiment of the present disclosure, the compensation electrode 80 may overlap all data lines 171.

In a liquid crystal display according to a present exemplary embodiment, the organic layer 180 is positioned on the first passivation layer 180x of the lower panel 100, and the color filter 230 and the light blocking member 220 are positioned on the upper panel 200. However, in a liquid crystal display according to another exemplary embodiment of the present disclosure, the color filter 230 may replace the organic layer 180 on the lower panel 100, and the color filter 230 may be omitted from the upper panel 200. In this case, the light blocking member 220 may also be positioned on the lower panel 100 instead of the upper panel 200.

As described with reference to FIG. 7, according to a liquid crystal display according to a present exemplary embodiment, to compensate a common voltage ripple generated by the coupling of the voltage applied to the data line 171 and the common electrode 270, a voltage having a polarity opposite to the common voltage ripple is applied to the compensation electrode 80 to prevent the ripple due to the coupling between the data line 171 and the common electrode 270.

Many features of a liquid crystal display according to the exemplary embodiment described with reference to FIG. 1 to FIG. 6 may be applied to a liquid crystal display according to a present exemplary embodiment of FIG. 9 to FIG. 11.

Figure 12:
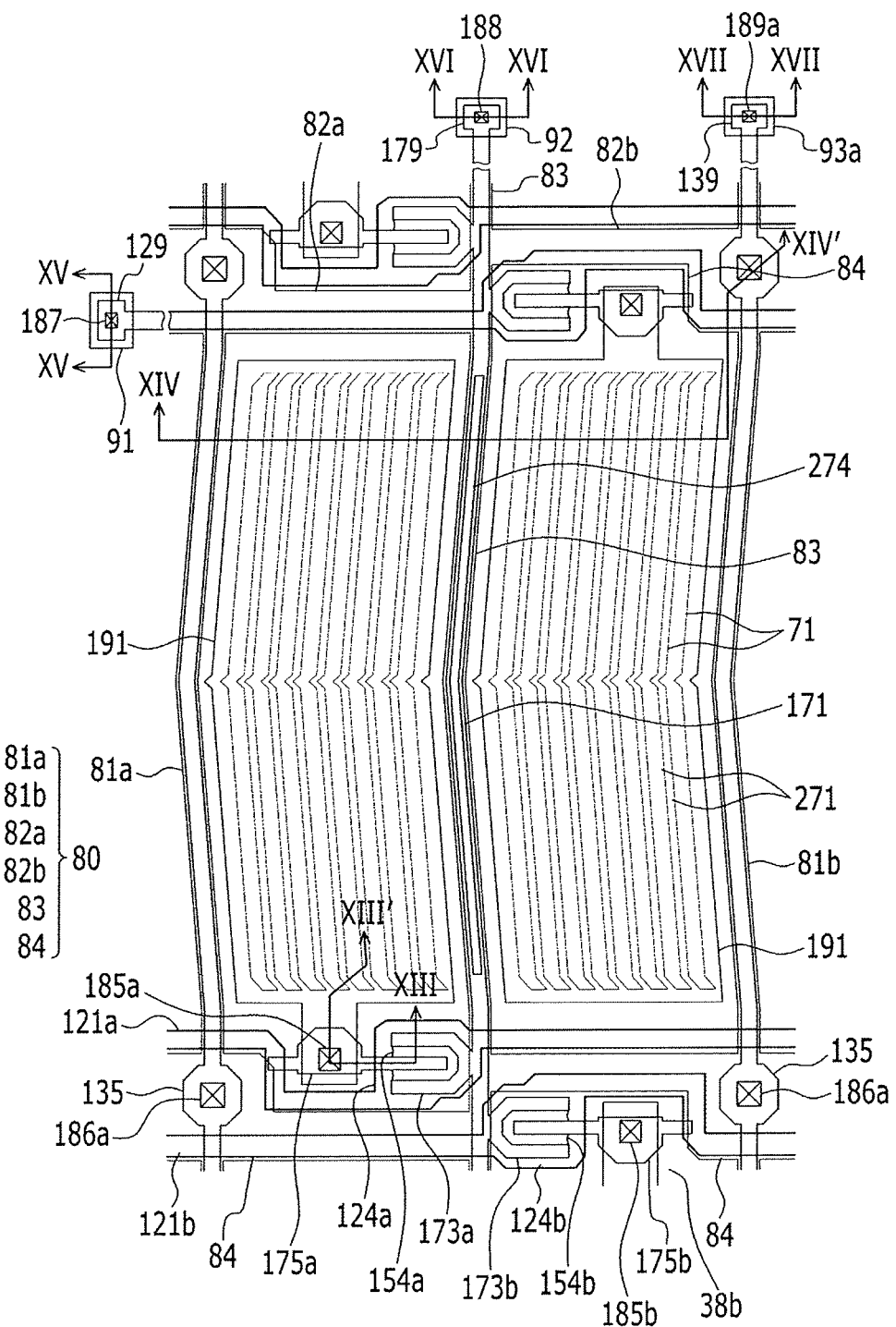
FIG. 12 is a layout view of a liquid crystal display according to another exemplary embodiment of the present disclosure.
Figure 13:
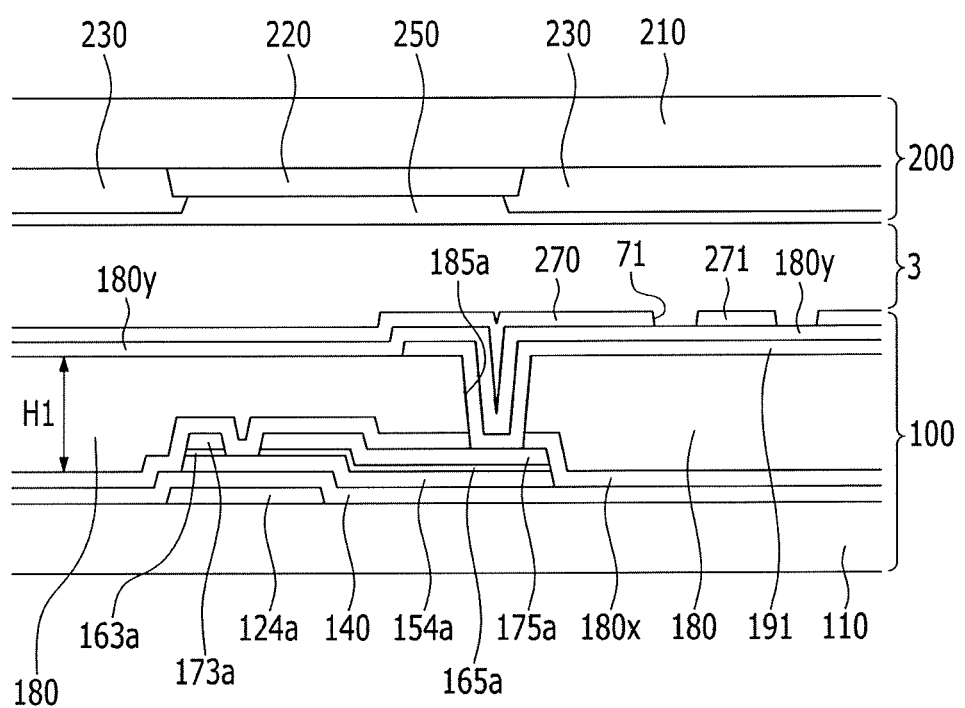
FIG. 13 is a cross-sectional view of the liquid crystal display of FIG. 12 taken along line XIII-XIII'.
Figure 14:
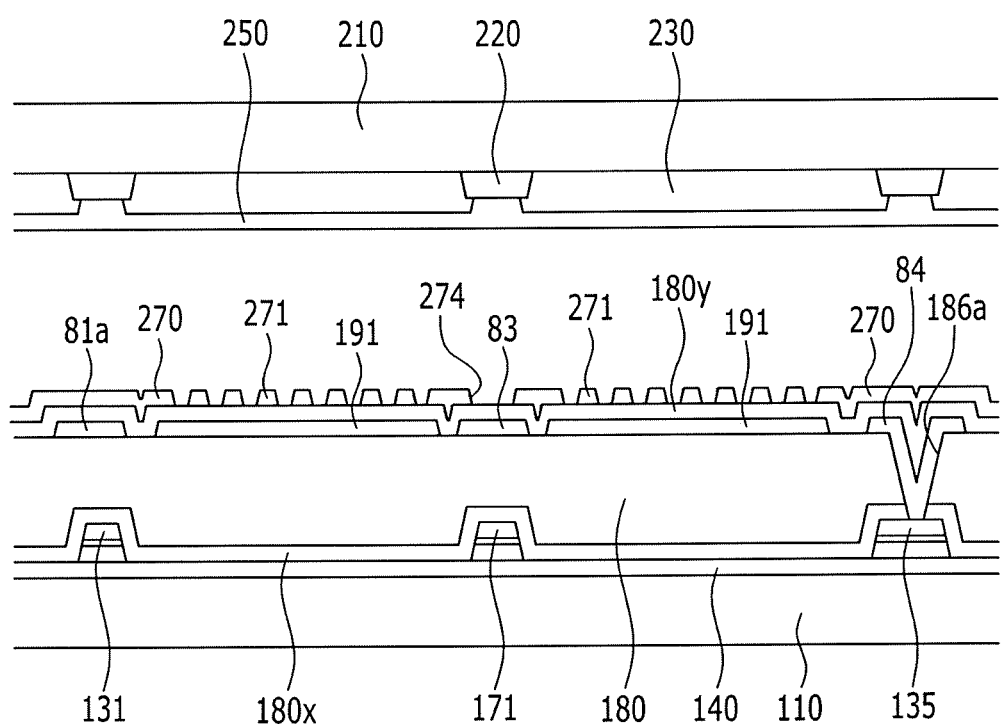
FIG. 14 is a cross-sectional view of the liquid crystal display of FIG. 12 taken along line XIV-XIV'.
Figure 15:
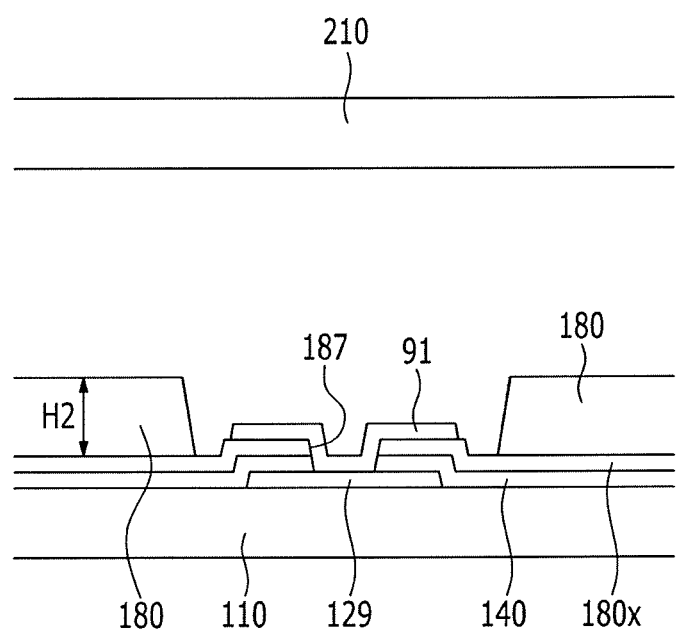
FIG. 15 is a cross-sectional view of the liquid crystal display of FIG. 12 taken along line XV-XV.
Figure 16:
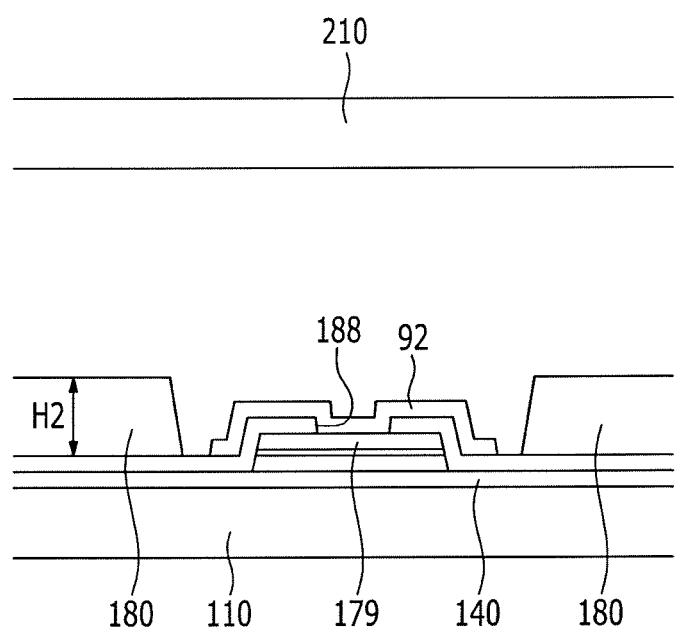
FIG. 16 is a cross-sectional view of the liquid crystal display of FIG. 12 taken along line XVI-XVI.
Figure 17:
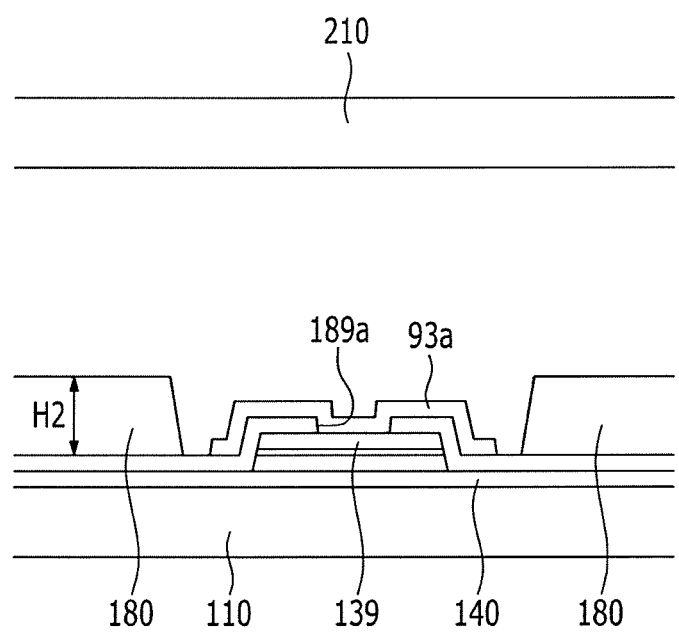
FIG. 17 is a cross-sectional view of the liquid crystal display of FIG. 12 taken along line XVII-XVII.

Next, a liquid crystal display according to another exemplary embodiment of the present disclosure will be described with reference to FIG. 12 to FIG. 17. FIG. 12 is a layout view of a liquid crystal display according to another exemplary embodiment of the present disclosure. FIG. 13 is a cross-sectional view of the liquid crystal display of FIG. 12 taken along line XIII-XIII'. FIG. 14 is a cross-sectional view of the liquid crystal display of FIG. 12 taken along line XIV-XIV'. FIG. 15 is a cross-sectional view of the liquid crystal display of FIG. 12 taken along line XV-XV. FIG. 16 is a cross-sectional view of the liquid crystal display of FIG. 12 taken along line XVI-XVI. FIG. 17 is a cross-sectional view of the liquid crystal display of FIG. 12 taken along line XVII-XVII.

Referring to FIG. 12 and FIG. 17, a liquid crystal display according to a present exemplary embodiment is similar to the liquid crystal display according to the exemplary embodiment of FIG. 1 to FIG. 6. The description of the same constituent elements is omitted.

Referring to FIG. 12 to FIG. 17, a liquid crystal display according to an exemplary embodiment of the present disclosure includes a lower panel 100 and an upper panel 200 facing each other, and a liquid crystal layer 3 interposed therebetween.

First, the lower panel 100 will be described.

A plurality of first and second gate lines 121a and 121b are disposed on a first insulation substrate 110.

The first gate line 121a and the second gate line 121b are disposed in pairs between pixel rows.

The first gate line 121a includes a first gate electrode 124a, and the second gate line 121b includes a second gate electrode 124b. Each of the gate lines 121a and 121b includes a wide gate pad portion 129 for connection with another layer or an external driving circuit.

A gate insulating layer 140 is disposed on a plurality of gate lines 121a and 121b.

A first semiconductor 154a and a second semiconductor 154b are disposed on the gate insulating layer 140.

Ohmic contacts 163a and 165a are disposed on the semiconductors 154a and 154b.

A plurality of data lines 171, a plurality of drain electrodes 175a and 175b, and a plurality of compensation voltage lines 131 are disposed on the ohmic contacts 163a and 165a.

The data line 171 transmits a data signal and extends in a substantially longitudinal direction thereby intersecting the gate lines 121a and 121b. Each data line 171 is associated with two columns of pixels.

Each data line 171 includes a first source electrode 173a that extends toward the first gate electrode 124a and a second source electrode 173b that extends toward the second gate electrode 124b.

Each data line 171 includes a wide data pad portion 179 for connection with another layer or an external driving circuit.

The first drain electrode 175a faces the first source electrode 173a and forms a thin film transistor (TFT) along with the first gate electrode 124a and the first semiconductor 154a, and the second drain electrode 175b faces the second source electrode 173b and forms a thin film transistor (TFT) along with the second gate electrode 124b and the second semiconductor 154b.

The compensation voltage line 131 extends parallel to the data line 171, and each compensation voltage line 131 may associated with two pixel columns. The data line 171 and the compensation voltage line 131 may be alternately disposed.

The compensation voltage line 131 includes a plurality of extensions 135 and a wide compensation pad portion 139 for connection with another layer or an external driving circuit.

A first passivation layer 180x is disposed on the plurality of data lines 171, the plurality of drain electrodes 175a and 175b, and the plurality of compensation voltage lines 131.

An organic layer 180 is disposed on the first passivation layer 180x. The organic layer 180 may be thicker than the first passivation layer 180x and have a flat surface.

The organic layer 180 may be positioned in the display area in which a plurality of pixels are positioned, and may not be positioned in a peripheral area in which the gate pad portion 129, the data pad portion 179, and the compensation pad portion 139 are disposed.

The organic layer 180 and the first passivation layer 180x have a first contact hole 185a that exposes the first drain electrode 175a, a second contact hole 185b that exposes the second drain electrode 175b, and a third contact hole 186a that exposes the extension 135 of the compensation voltage line 131.

A pixel electrode 191 and a compensation electrode 80 are disposed on the organic layer 180.

The pixel electrode 191 is positioned on both sides of the data line 171, and is connected to the first drain electrode 175a through the first contact hole 185a and the second drain electrode 175b through the second contact hole 185b.

The compensation electrode 80 includes a first longitudinal portion 81a, a second longitudinal portion 81b, a first transverse portion 82a, a second transverse portion 82b, and a shielding electrode 83. The first longitudinal portion 81a and the second longitudinal portion 81b overlap and extend parallel to two compensation voltage lines 131 positioned at both side of the data line. The first transverse portion 82a extends from the first longitudinal portion 81a parallel to the direction of the gate lines 121a and 121b, and the second transverse portion 82b extends from the second longitudinal portion 81b parallel to the direction of the gate lines 121a and 121b. The shielding electrode 83 is connected to the first transverse portion 82a and the second transverse portion 82b, and overlaps and is parallel to the data line 171.

The first longitudinal portion 81a and the second longitudinal portion 81b of the compensation electrode 80 include a plurality of first connections 84 that overlap the extension 135 of the compensation voltage line 131.

The pixel electrode 191 and the compensation electrode 80 may be simultaneously formed from the same layer.

The first connection 84 of the compensation electrode 80 is connected to the compensation voltage line 131 through the third contact hole 186a.

A second passivation layer 180y is disposed on the pixel electrode 191 and the compensation electrode 80.

The second passivation layer 180y, the first passivation layer 180x, and the gate insulating layer 140 have a fourth contact hole 187 at a region positioned at the gate pad portion 129 where they do not overlap the organic layer 180 that exposes the gate pad portion 129. Similarly, the second passivation layer 180y and the first passivation layer 180x have a fifth contact hole 188 at a region positioned at the data pad portion 179 where they do not overlap the organic layer 180 that exposes the data pad portion 179, and the second passivation layer 180y and the first passivation layer 180x have a sixth contact hole 189a at a region positioned at the compensation pad portion 139 where they do not overlap the organic layer 180 that exposes the compensation pad portion 139.

A common electrode 270, a first contact assistant 91, a second contact assistant 92, and a third contact assistant 93a are disposed on the second passivation layer 180y.

The common electrode 270 has a plurality of first cutouts 71 in the pixel area and a plurality of first branch electrodes 271 defined by the plurality of first cutouts 71. A plurality of first branch electrodes 271 overlap the pixel electrode 191. A plurality of first branch electrodes 271 extend in a direction substantially parallel to the data line 171.

The common electrode 270 includes a second cutout 274 in a region that overlaps the data line 171.

The first contact assistant 91 is positioned on the gate pad portion 129 exposed through the fourth contact hole 187, the second contact assistant 92 is positioned on the data pad portion 179 exposed through the fifth contact hole 188, and the third contact assistant 93a is positioned on the compensation pad portion 139 exposed through the sixth contact hole 189a.

As described above, different from the liquid crystal display according to a exemplary embodiment as described with reference to FIG. 1 to FIG. 6, the common electrode 270 of a liquid crystal display according to a present exemplary embodiment further has a second cutout 274 that overlaps the data line 171. The second cutouts 274 in the common electrode 270 may reduce the overlap area between the data line 171 and the common electrode 270. Accordingly, the coupling between the data line 171 and the common electrode 270 may be reduced, which may prevent a common voltage ripple from being generated by the coupling between the data line 171 and the common electrode 270.

Now, the upper display panel 200 will be described.

A light blocking member 220 and a color filter 230 are disposed on the second insulation substrate 210, and an overcoat 250 is disposed on the color filter 230 and the light blocking member 220.

The liquid crystal layer 3 includes a plurality of liquid crystal molecules positioned on the pixel electrode 191 and common electrode 270 that are aligned so that long axial directions thereof are parallel to the panels 100 and 200.

The pixel electrode 191 receives a data voltage from the drain electrode 175, and the common electrode 270 receives a common voltage having a predetermined magnitude from a common voltage application unit disposed outside the display area.

The pixel electrode 191 and the common electrode 270 are the field generating electrodes that generate an electric field that rotates the liquid crystal molecules of the liquid crystal layer 3 in a direction parallel with a direction of the electric field. The polarization of light passing through the liquid crystal layer 3 changes according to the rotation direction of the liquid crystal molecules as described above.

In a liquid crystal display according to a exemplary embodiment as shown in FIG. 12 to FIG. 17, the organic layer 180 is positioned on the first passivation layer 180x of the lower panel 100, and the color filter 230 and the light blocking member 220 are positioned on the upper panel 200. However, in a case of a liquid crystal display according to another exemplary embodiment of the present disclosure, the color filter 230 may replace the organic layer 180 on the lower panel 100, and the color filter 230 may be omitted from the upper panel 200. In this case, the light blocking member 220 may also be positioned on the lower panel 100 instead of the upper panel 200.

As described with reference to FIG. 7, according to a liquid crystal display according to a present exemplary embodiment, to compensate a common voltage ripple generated by the coupling of the voltage applied to the data line 171 and the common electrode 270, a voltage having a polarity opposite to the ripple voltage is applied to the compensation electrode 80 to prevent the ripple due to the coupling between the data line 171 and the common electrode 270.

In addition, in a liquid crystal display according to a present exemplary embodiment, the second cutouts 274 in the common electrode 270 may reduce the overlap area between the data line 171 and the common electrode 270. Accordingly, by reducing the coupling between the data line 171 and the common electrode 270, the common voltage ripple generated by the coupling between the data line 171 and the common electrode 270 may be further prevented.

Many features of a liquid crystal display according to an exemplary embodiment described with reference to FIG. 1 to FIG. 6 may be applied to the liquid crystal display according to a present exemplary embodiment.

Figure 18:
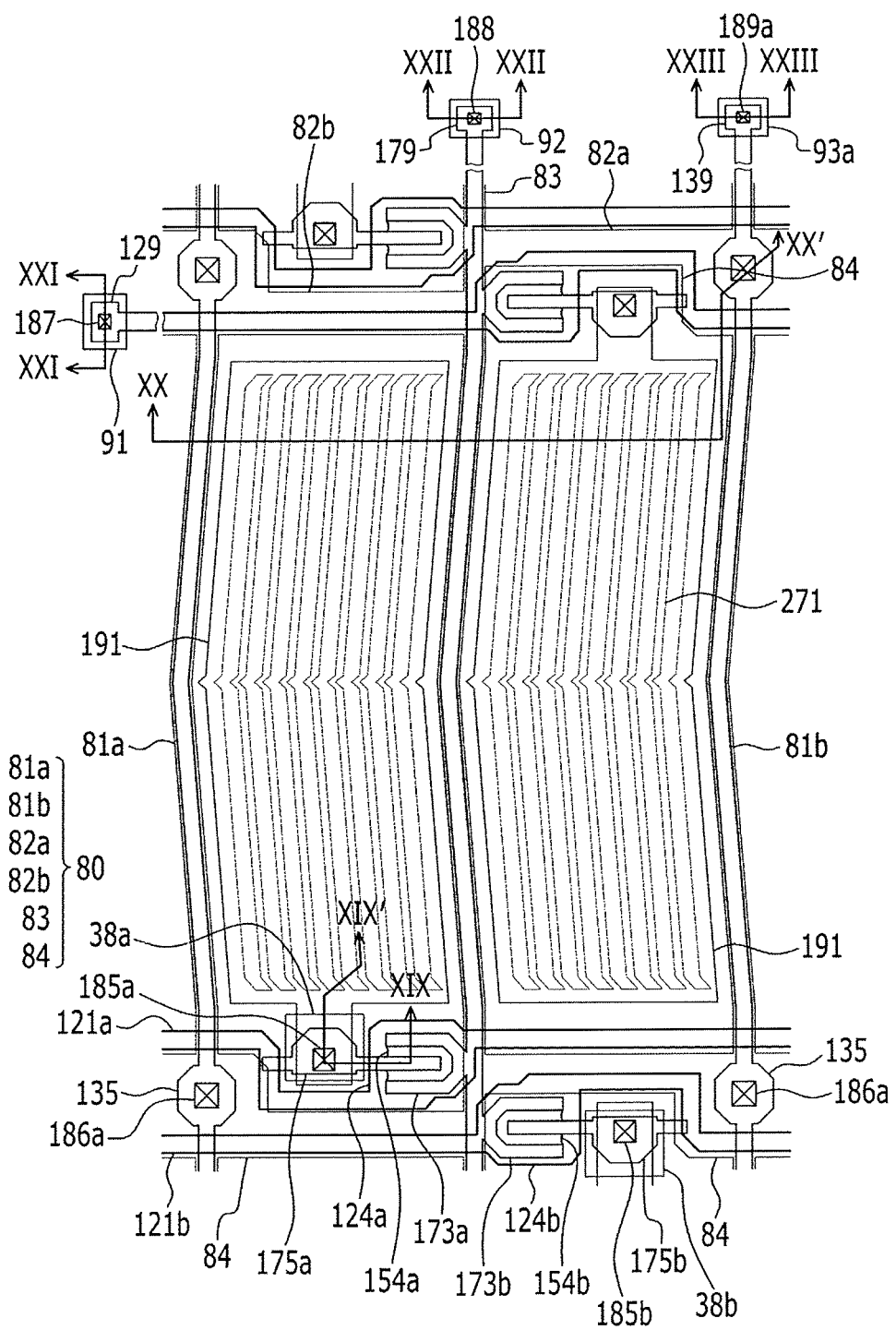
FIG. 18 is a layout view of a liquid crystal display according to another exemplary embodiment of the present disclosure.
Figure 19:
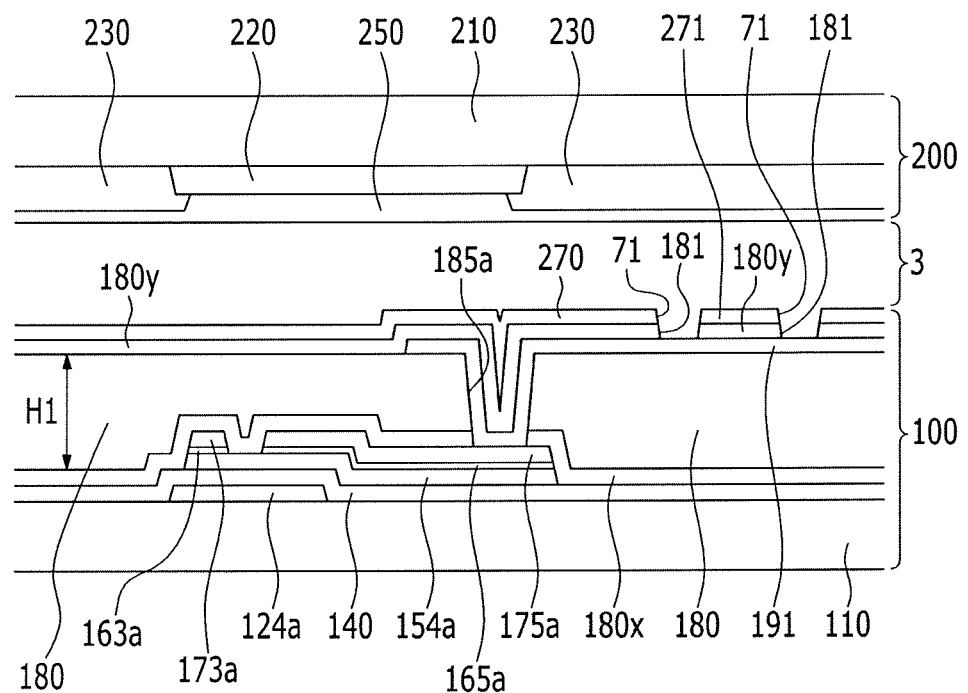
FIG. 19 is a cross-sectional view of the liquid crystal display of FIG. 18 taken along line XIX-XIX'.
Figure 20:
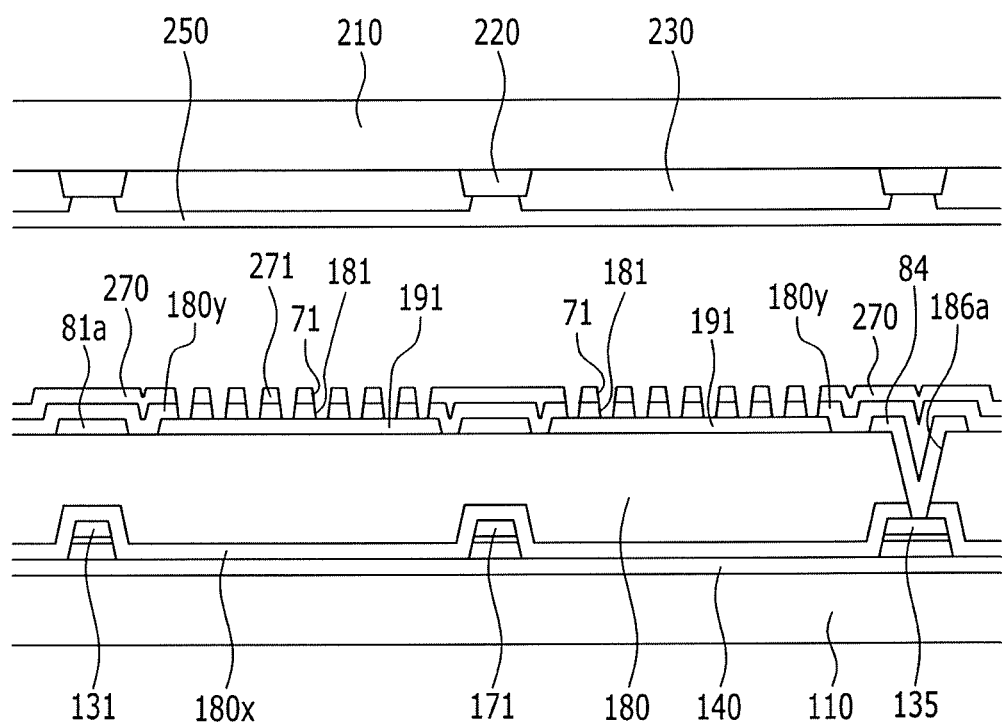
FIG. 20 is a cross-sectional view of the liquid crystal display of FIG. 18 taken along line XX-XX'.
Figure 21:
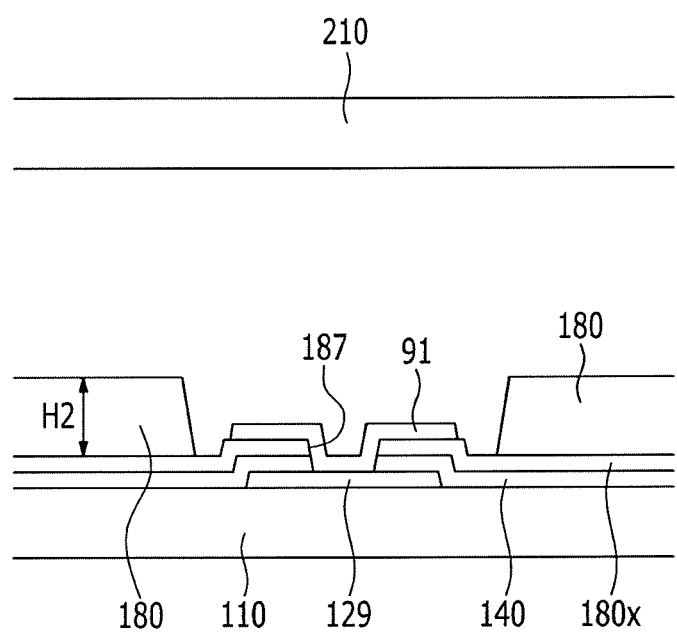
FIG. 21 is a cross-sectional view of the liquid crystal display of FIG. 18 taken along line XXI-XXI.
Figure 22:
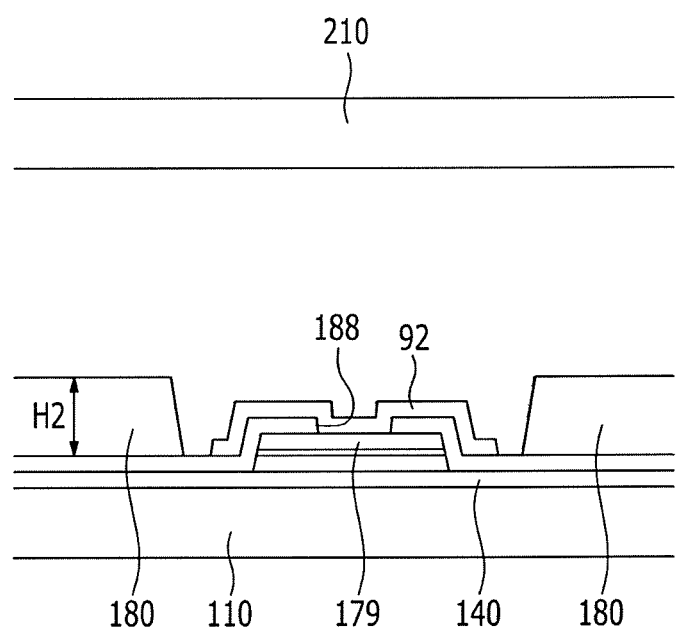
FIG. 22 is a cross-sectional view of the liquid crystal display of FIG. 18 taken along line XXII-XXII.
Figure 23:
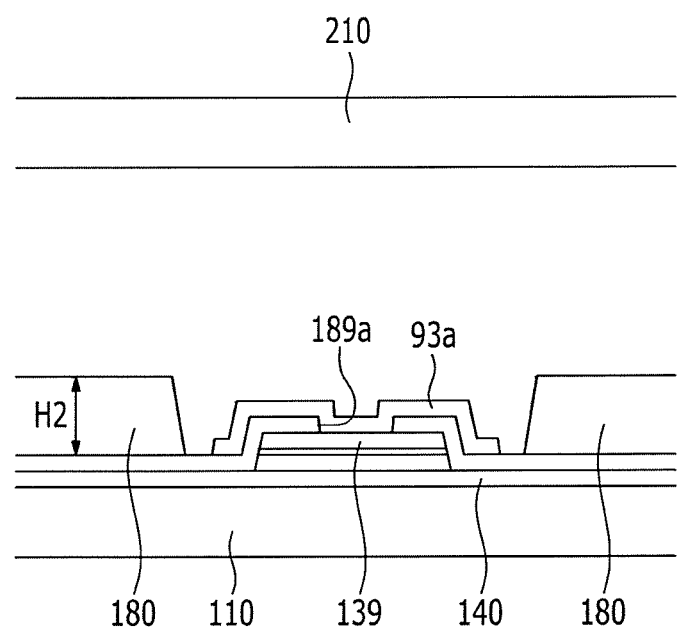
FIG. 23 is a cross-sectional view of the liquid crystal display of FIG. 18 taken along line XXIII-XXIII.

Next, a liquid crystal display according to another exemplary embodiment of the present disclosure will be described with reference to FIG. 18 to FIG. 23. FIG. 18 is a layout view of a liquid crystal display according to another exemplary embodiment of the present disclosure. FIG. 19 is a cross-sectional view of the liquid crystal display of FIG. 18 taken along line XIX-XIX'. FIG. 20 is a cross-sectional view of the liquid crystal display of FIG. 18 taken along line XX-XX'. FIG. 21 is a cross-sectional view of the liquid crystal display of FIG. 18 taken along line XXI-XXI. FIG. 22 is a cross-sectional view of the liquid crystal display of FIG. 18 taken along line XXII-XXII. FIG. 23 is a cross-sectional view of the liquid crystal display of FIG. 18 taken along line XXIII-XXIII.

Referring to FIG. 18 and FIG. 23, a liquid crystal display according to a present exemplary embodiment is similar to the liquid crystal display according to the exemplary embodiment of FIG. 1 to FIG. 6. The description of the same constituent elements is omitted.

Referring to FIG. 18 to FIG. 23, a liquid crystal display according to an exemplary embodiment of the present disclosure includes a lower panel 100 and an upper panel 200 facing each other, and a liquid crystal layer 3 interposed therebetween.

First, the lower panel 100 will be described.

A plurality of first and second gate lines 121a and 121b are disposed on a first insulation substrate 110. The first gate line 121a and the second gate line 121b are disposed in pairs between pixel rows.

The first gate line 121a includes a first gate electrode 124a, and the second gate line 121b includes a second gate electrode 124b. Each of the gate lines 121a and 121b includes a wide gate pad portion 129 for connection with another layer or an external driving circuit.

A gate insulating layer 140 is disposed on the plurality of gate lines 121a and 121b.

A first semiconductor 154a and a second semiconductor 154b are disposed on the gate insulating layer 140.

Ohmic contacts 163a and 165a are disposed on the semiconductors 154a and 154b.

A plurality of data lines 171, a plurality of drain electrodes 175a and 175b, and a plurality of compensation voltage lines 131 are disposed on the ohmic contacts 163a and 165a.

The data line 171 transmits a data signal and extends in a substantially longitudinal direction thereby intersecting the gate lines 121a and 121b. Each data line 171 is associated with two columns of pixels.

Each data line 171 includes a first source electrode 173a that extends toward the first gate electrode 124a and a second source electrode 173b that extends toward the second gate electrode 124b.

Each data line 171 includes a wide data pad portion 179 for connection with another layer or an external driving circuit.

The first drain electrode 175a faces the first source electrode 173a and forms a thin film transistor (TFT) along with the first gate electrode 124a and the first semiconductor 154a, and the second drain electrode 175b faces the second source electrode 173b and forms a thin film transistor (TFT) along with the second gate electrode 124b and the second semiconductor 154b.

The compensation voltage line 131 extends parallel to the data line 171 and each may be associated with two pixel columns. The data line 171 and the compensation voltage line 131 may be alternately disposed.

The compensation voltage line 131 includes a plurality of extensions 135 and a wide compensation pad portion 139 for connection with another layer or an external driving circuit.

A first passivation layer 180x is disposed on the plurality of data lines 171, the plurality of drain electrodes 175a and 175b, and the plurality of compensation voltage lines 131.

An organic layer 180 is disposed on the first passivation layer 180x. The organic layer 180 may be thicker than the first passivation layer 180x and have a flat surface.

The organic layer 180 may be positioned in the display area in which a plurality of pixels are positioned and may not be positioned in a peripheral area in which the gate pad portion 129, the data pad portion 179, and the compensation pad portion 139 are positioned.

A first height H1 of the organic layer 180 positioned at the display area may be greater than a second height H2 of the organic layer 180 positioned near the gate pad portion 129, the data pad portion 179, and the compensation pad portion 139.

The organic layer 180 and the first passivation layer 180x have a first contact hole 185a that exposes the first drain electrode 175a, a second contact hole 185b that exposes the second drain electrode 175b, and a third contact hole 186a that exposes the extension 135 of the compensation voltage line 131.

The second passivation layer 180y and the first passivation layer 180x have a fourth contact hole 187 at a region positioned at the gate pad portion 129 where they do not overlap the organic layer 180 that exposes the gate pad portion 129. Similarly, the first passivation layer 180x has a fifth contact hole 188 at a region positioned at the data pad portion 179 where it does not overlap the organic layer 180 that exposes the data pad portion 179, and the first passivation layer 180x has a sixth contact hole 189a at a region positioned at the compensation pad portion 139 where it does not overlap the organic layer 180 that exposes the compensation pad portion 139.

A pixel electrode 191 and a compensation electrode 80 are disposed on the organic layer 180.

The pixel electrode 191 includes a curved edge that is substantially parallel to a first curved portion of the data line 171. The pixel electrode 191 is formed from a transparent conductive layer such as ITO or IZO.

The pixel electrode 191 is positioned on both sides of the data line 171, and is connected to the first drain electrode 175a through the first contact hole 185a and the second drain electrode 175b through the second contact hole 185b.

The compensation electrode 80 includes a first longitudinal portion 81a, a second longitudinal portion 81b, a first transverse portion 82a, a second transverse portion 82b and a shielding electrode 83. The first longitudinal portion 81a and second longitudinal portion 81b overlap and extend parallel to two compensation voltage lines 131 positioned at both sides of the data line. The first transverse portion 82a extends from the first longitudinal portion 81a parallel to the direction of the gate lines 121a and 121b, and the second transverse portion 82b extends from the second longitudinal portion 81b parallel to the direction of the gate lines 121a and 121b. The shielding electrode 83 is connected to the first transverse portion 82a and the second transverse portion 82b, and overlaps and is parallel to the data line 171.

The pixel electrode 191 and the compensation electrode 80 may be simultaneously formed from the same layer.

The first longitudinal portion 81a and the second longitudinal portion 81b of the compensation electrode 80 include a plurality of first connections 84 that overlap the extension 135 of the compensation voltage line 131.

The first connection 84 of the compensation electrode 80 is connected to the compensation voltage line 131 through the third contact hole 186a.

A second passivation layer 180y is disposed on the pixel electrode 191 and the compensation electrode 80, and a common electrode 270, a first contact assistant 91, a second contact assistant 92, and a third contact assistant 93a are disposed on the second passivation layer 180y. The common electrode 270 is formed from a transparent conductive layer such as ITO or IZO.

The first contact assistant 91 is positioned on the gate pad portion 129 exposed through the fourth contact hole 187, the second contact assistant 92 is positioned on the data pad portion 179 exposed through the fifth contact hole 188, and the third contact assistant 93a is positioned on the compensation pad portion 139 exposed through the sixth contact hole 189a.

The second passivation layer 180y and the common electrode 270 have substantially the same planar shape.

The second passivation layer 180y and the common electrode 270 are positioned in the display area where a plurality of pixels are positioned, but are not positioned at the peripheral area where the gate pad portion 129 and the data pad portion 179 are positioned.

The common electrode 270 has a plurality of first cutouts 71, and the second passivation layer 180y has a plurality of third cutouts 181. The first cutouts 71 and the third cutouts 181 have substantially the same planar shape. That is, an edge of the first cutout 71 and an edge of the third cutout 181 overlap each other. Therefore, the second passivation layer 180y and the common electrode 270 may be formed together using one photomask.

The common electrode 270 includes a sixth cutout 38a and a seventh cutout 38b near the first drain electrode 175a and the second drain electrode 175b.

In addition, a horizontal first alignment layer rubbed in a predetermined direction may be applied on the pixel electrode 191 and the common electrode 270 exposed through the third cutout. However, in a liquid crystal display according to another exemplary embodiment of the present disclosure, the first alignment layer may include a photoreactive material to be photo-aligned.

Now, the upper display panel 200 will be described.

A light blocking member 220 is disposed on a second insulating substrate 210 made of transparent glass, plastic, etc. A plurality of color filters 230 are also disposed on the second substrate 210.

An overcoat 250 is disposed on the color filter 230 and the light blocking member 220.

In addition, a second alignment layer may be disposed on the overcoat 250.

The liquid crystal layer 3 includes a plurality of liquid crystal molecules positioned on the pixel electrode 191 and common electrode 270that are arranged such that long axis direction thereof is aligned parallel to the display panels 100 and 200.

The pixel electrode 191 receives a data voltage from the drain electrodes 175a and 175b and the common electrode 270 receives a common voltage having a predetermined magnitude from a common voltage applying unit which is disposed outside the display region.

The pixel electrode 191 and the common electrode 270 are field generating electrodes that generate an electric field that rotate the liquid crystal molecules of the liquid crystal layer 3 in a direction parallel with a direction of the electric field. The polarization of light passing through the liquid crystal layer 3 changes according to the rotation direction of the liquid crystal molecules as described above.

In a liquid crystal display according to a present exemplary embodiment, the organic layer 180 is positioned on the first passivation layer 180x of the lower panel 100, and the color filter 230 and the light blocking member 220 are positioned on the upper panel 200. However, in a liquid crystal display according to another exemplary embodiment of the present disclosure, the color filter 230 may replace the organic layer 180 on the lower panel 100 and the color filter 230 may be omitted from the upper panel 200. In this case, the light blocking member 220 may also be positioned on the lower panel 100 instead of the upper panel 200.

As described above, according to a liquid crystal display of a present exemplary embodiment, different from a liquid crystal display according to a exemplary embodiment described with reference to FIG. 1 to FIG. 6, the common electrode 270 has a plurality of first cutouts 71, the second passivation layer 180y has a plurality of third cutouts 181, and the first cutouts 71 and the third cutouts 181 have substantially the same planar shape. That is, an edge of the first cutout 71 and an edge of the third cutout 181 180y overlap. Therefore, the second passivation layer 180y and the common electrode 270 may be formed together with one photomask.

The second passivation layer 180y and the common electrode 270 are positioned in the display area where a plurality of pixels are positioned, but are not positioned in the peripheral area where the gate pad portion 129 and the data pad portion 179 are positioned.

By forming the second passivation layer 180y and the common electrode 270 with one photomask, manufacturing cost of the liquid crystal display may be reduced.

The data line 171 and the common electrode 270 overlap each other such that a common voltage ripple may be generated by the coupling of the voltage applied to the data line 171 and the common electrode 270. However, as described above, the compensation electrode 80 of a liquid crystal display according to an exemplary embodiment of the present disclosure includes a shielding electrode 83 that overlaps the data line 171, and to compensate the ripple of the common voltage, a voltage having a polarity opposite to the common voltage ripple is applied to the compensation electrode 80, thereby preventing the ripple due to the coupling between the data line 171 and the common electrode 270.

According to a liquid crystal display of another exemplary embodiment of the present disclosure, the shielding electrode 83 of the compensation electrode 80 overlaps some, but not all of the plurality of data lines 171.

Many characteristics of a liquid crystal displays according to the exemplary embodiments described with reference to FIG. 1 to FIG. 6 and FIG. 8 may be applied to a liquid crystal display of a present exemplary embodiment.

Figure 24:
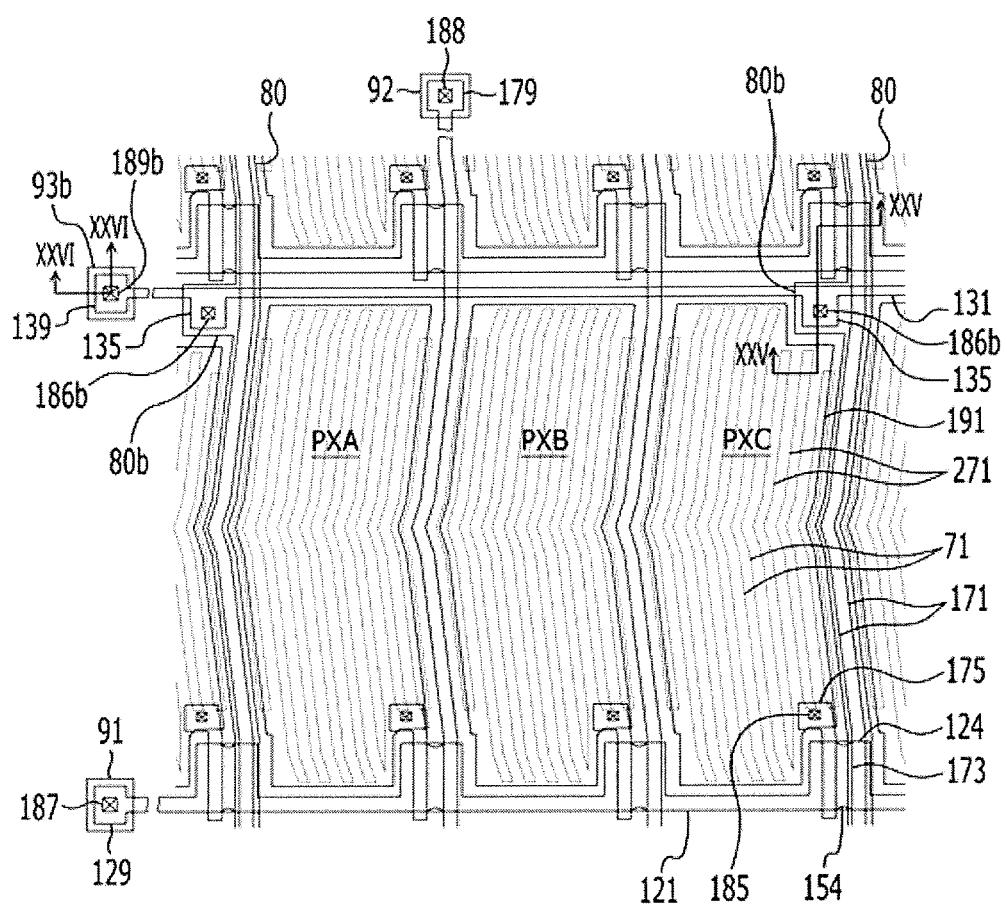
FIG. 24 is a layout view of a liquid crystal display according to another exemplary embodiment of the present disclosure.
Figure 25:
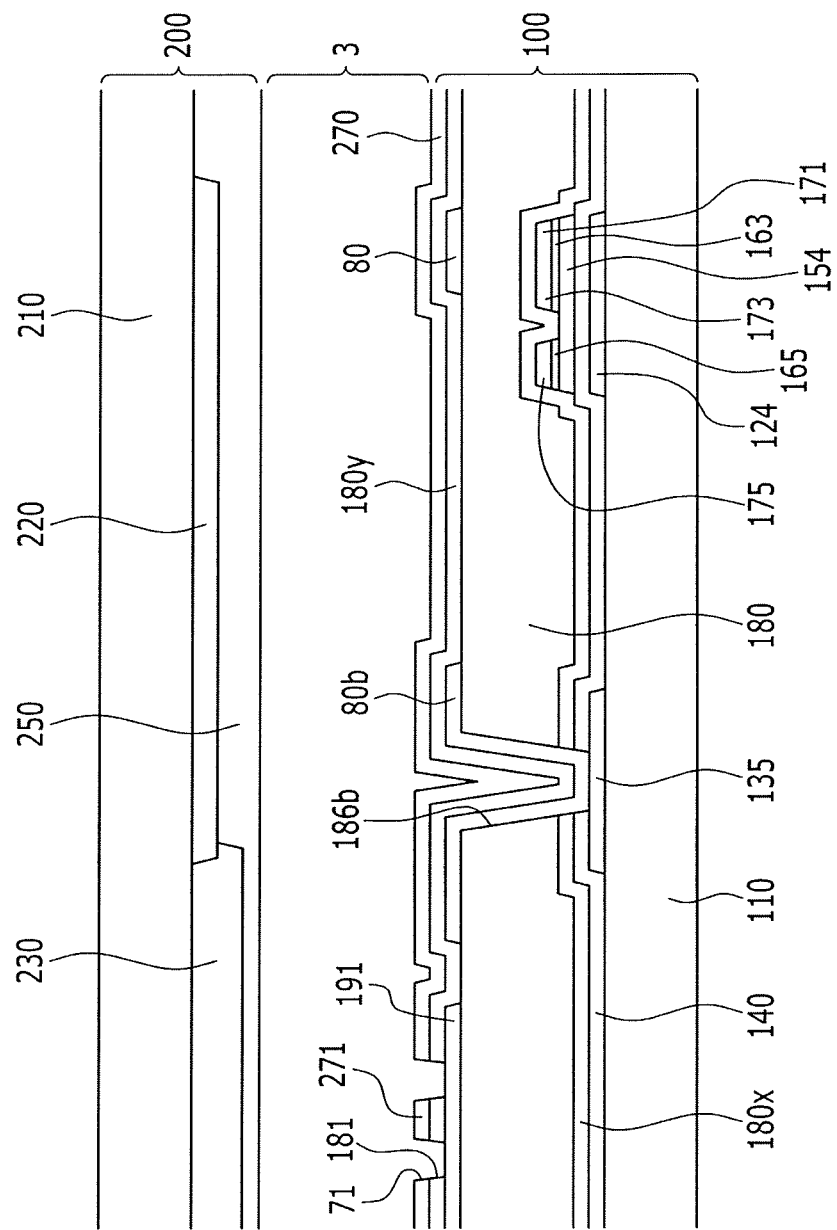
FIG. 25 is a cross-sectional view of the liquid crystal display of FIG. 24 taken along line XXV-XXV.
Figure 26:
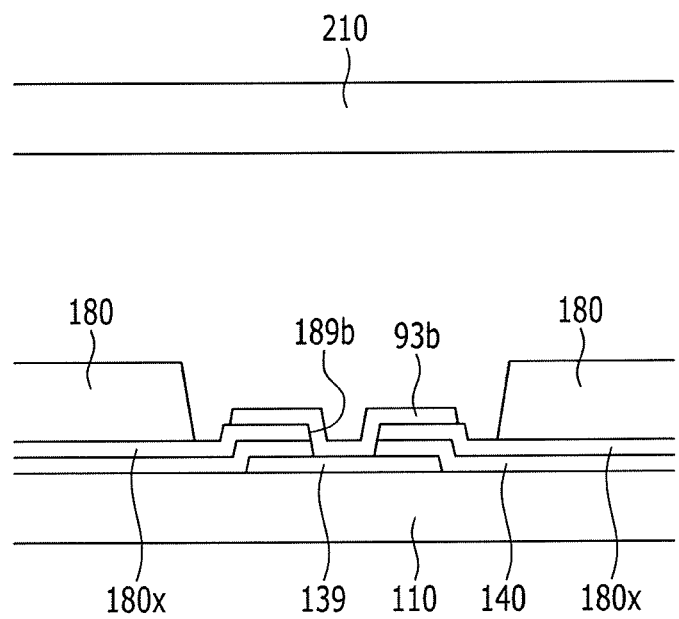
FIG. 26 is a cross-sectional view of the liquid crystal display of FIG. 24 taken along line XXVI-XXVI.

Next, a liquid crystal display according to another exemplary embodiment of the present disclosure will be described with reference to FIG. 24 to FIG. 26. FIG. 24 is a layout view of a liquid crystal display according to another exemplary embodiment of the present disclosure. FIG. 25 is a cross-sectional view of the liquid crystal display of FIG. 24 taken along line XXV-XXV. FIG. 26 is a cross-sectional view of the liquid crystal display of FIG. 24 taken along line XXVI-XXVI.

Referring to FIG. 24 to FIG. 26, the liquid crystal display according to the present exemplary embodiment includes a lower panel 100 and an upper panel 200 facing each other, and a liquid crystal layer 3 interposed therebetween.

First, the lower panel 100 will be described.

A gate line 121 and a compensation voltage line 131 are disposed on a first insulation substrate 110 made of transparent glass or plastic. The gate line 121 and the compensation voltage line 131 are formed together from a same layer.

The gate line 121 includes agate electrode 124 and a gate pad portion 129.

The compensation voltage line 131 extends parallel to the gate line 121 and includes a plurality of extensions 135 and a compensation pad portion 139.

A gate insulating layer 140 is disposed on the gate line 121 and the compensation voltage line 131.

A semiconductor 154 is disposed on the gate insulating layer 140.

Ohmic contacts 163 and 165 are disposed on the semiconductor 154.

A data conductor that includes a data line 171, a source electrode 173 and a drain electrode 175 is disposed on the ohmic contacts 163 and 165 and the gate insulating layer 140.

The source electrode 173 is a portion of the data line 171, and is positioned on the same line as the data line 171. The drain electrode 175 may be disposed parallel to the source electrode 173. Accordingly, the drain electrode 175 is parallel to a portion of the data line 171.

A first passivation layer 180x is disposed on the data conductors 171, 173, and 175, the gate insulating layer 140, and the exposed portion of the semiconductor 154.

An organic layer 180 is disposed on the first passivation layer 180x. The organic layer 180 is thicker than the first passivation layer 180x and may have a flat surface.

The organic layer 180 may be positioned in the display area where a plurality of pixels are positioned, and may not be positioned in the peripheral area where the gate pad portion and the data pad portion are positioned. Alternatively, the organic layer 180 may be positioned in the peripheral area where the gate pad portion and the data pad portion are positioned, where the organic layer 180 may have a lower surface height than the organic layer 180 positioned at the display area.

The organic layer 180 and the first passivation layer 180x have a seventh contact hole 185 that exposes the drain electrode 175.

The organic layer 180, the first passivation layer 180x, and the gate insulating layer 140 have an eighth contact hole 186b that exposes the compensation voltage line 131.

The first passivation layer 180x and the gate insulating layer 140 have a fourth contact hole 187 at a region positioned at the gate pad portion 129 where they do not overlap the organic layer 180 that exposes the gate pad portion 129. Similarly, the first passivation layer 180x has a fifth contact hole 188 at a region positioned at the data pad portion 179 where it does not overlap the organic layer 180 that exposes the data pad portion 179. The first passivation layer 180x and the gate insulating layer 140 have a ninth contact hole 189b at a region positioned at the compensation pad portion 139 where they do not overlap the organic layer 180 that exposes the compensation pad portion 139.

A pixel electrode 191 and a compensation electrode 80 are disposed on the organic layer 180. The compensation electrode 80 overlaps the data line 171 and extends along with the data line 171. The compensation electrode 80 includes a second connection 80b that extends toward the extension 135 of the compensation voltage line 131.

The second connection 80b of the compensation electrode 80 is connected to the compensation voltage line 131 through the eighth contact hole 186b.

The pixel electrode 191 and the compensation electrode 80 may be simultaneously formed from a same layer.

A second passivation layer 180y is disposed on the pixel electrode 191 and the compensation electrode 80, and a common electrode 270, a first contact assistant 91, a second contact assistant 92, and a fourth contact assistant 93b are disposed on the second passivation layer 180y. The common electrode 270 is formed from a transparent conductive layer such as ITO or IZO.

The first contact assistant 91 is positioned on the gate pad portion 129 exposed through the fourth contact hole 187, the second contact assistant 92 is positioned on the data pad portion 179 exposed through the fifth contact hole, and the fourth contact assistant 93b is positioned on the compensation pad portion 139 exposed through the nine contact hole 189b.

The second passivation layer 180y and the common electrode 270 positioned on the second passivation layer 180y have substantially the same planar shape.

The second passivation layer 180y and the common electrode 270 are positioned in the display area where a plurality of pixels are positioned, but are not positioned at the peripheral area where the gate pad portion 129 and the data pad portion 179 are positioned.

The common electrode 270 has a plurality of first cutouts 71, and the second passivation layer 180y has a plurality of third cutouts 181. The first cutout 71 of the common electrode 270 and the third cutout 181 of the second passivation layer 180y have substantially the same planar shape. That is, an edge of the first cutout 71 and an edge of the third cutout 181 overlap each other. Therefore, the second passivation layer 180y and the common electrode 270 may be formed together using one photomask.

Now, the upper display panel 200 will be described.

A light blocking member 220 and a color filter 230 are disposed on the second insulation substrate 210, and an overcoat 250 is disposed on the color filter 230 and the light blocking member 220.

According to a liquid crystal display of the present exemplary embodiment, the compensation electrode 80 overlaps some, but not all data lines 171. However, according to a liquid crystal display of another exemplary embodiment of the present disclosure, the compensation electrode 80 may overlap all data lines 171.

In a liquid crystal display according to the present exemplary embodiment, the organic layer 180 is positioned on the first passivation layer 180x of the lower panel 100, and the color filter 230 and the light blocking member 220 are positioned on the upper panel 200. However, in a liquid crystal display according to another exemplary embodiment of the present disclosure, the color filter 230 may replace the organic layer 180 on the lower panel 100 and the color filter 230 may be omitted from the upper panel 200. In this case, the light blocking member 220 may also be positioned on the lower panel 100 instead of the upper panel 200.

As described above, according to a liquid crystal display of a present exemplary embodiment, different from a liquid crystal display according to a exemplary embodiment described with reference to FIG. 9 to FIG. 11, the common electrode 270 has a plurality of first cutouts 71, the second passivation layer 180y has a plurality of third cutouts 181, and the first cutouts 71 and the third cutouts 181 have substantially the same planar shape. That is, the edge of the first cutouts 71 and the edge of the third cutouts 181 overlap. Therefore, the second passivation layer 180y and the common electrode 270 may be formed together with one photomask.

The second passivation layer 180y and the common electrode 270 are positioned in the display area where a plurality of pixels are positioned, but are not positioned at the peripheral area where the gate pad portion 129 and the data pad portion 179 are positioned.

By forming the second passivation layer 180y and the common electrode 270 together with one photomask, manufacturing cost of the liquid crystal display may be reduced.

As described with reference to FIG. 7, according to a liquid crystal display according to a present exemplary embodiment, to compensate a common voltage ripple generated by the coupling of the voltage applied to the data line 171 and the common electrode 270, a voltage having an opposite polarity to the ripple voltage is applied to the compensation electrode 80, to prevent the ripple due to the coupling between the data line 171 and the common electrode 270.

Many characteristics of a liquid crystal displays according to exemplary embodiments described with reference to FIG. 1 to FIG. 6, FIG. 9 to FIG. 11, FIG. 12 to FIG. 17, and FIG. 18 to FIG. 23 may be applied to a liquid crystal display of a present exemplary embodiment.

Figure 27:
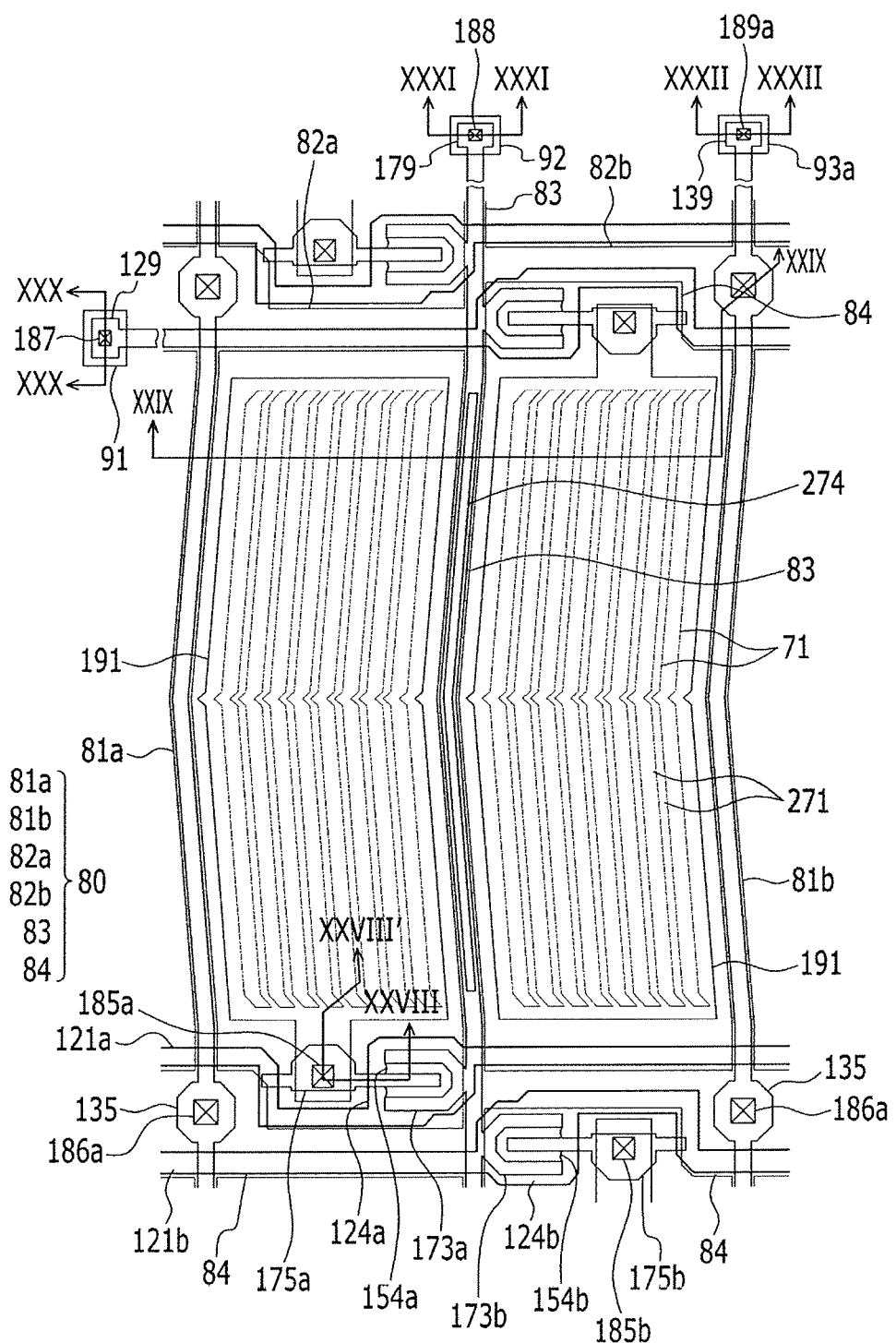
FIG. 27 is a layout view of a liquid crystal display according to another exemplary embodiment of the present disclosure.
Figure 28:
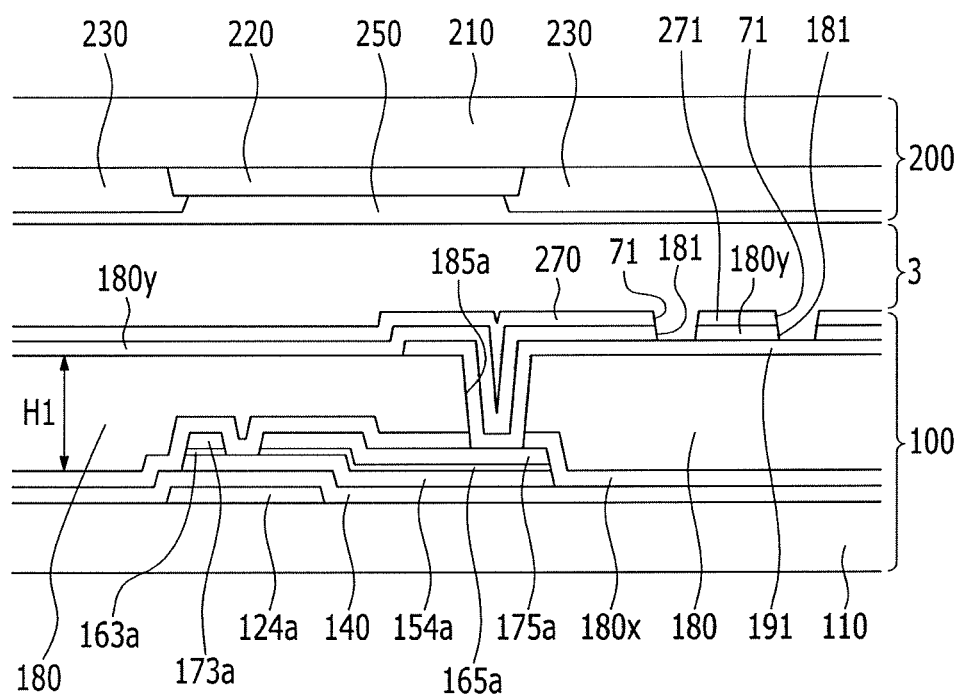
FIG. 28 is a cross-sectional view of the liquid crystal display of FIG. 27 taken along the line XXVIII-XXVIII.
Figure 29:
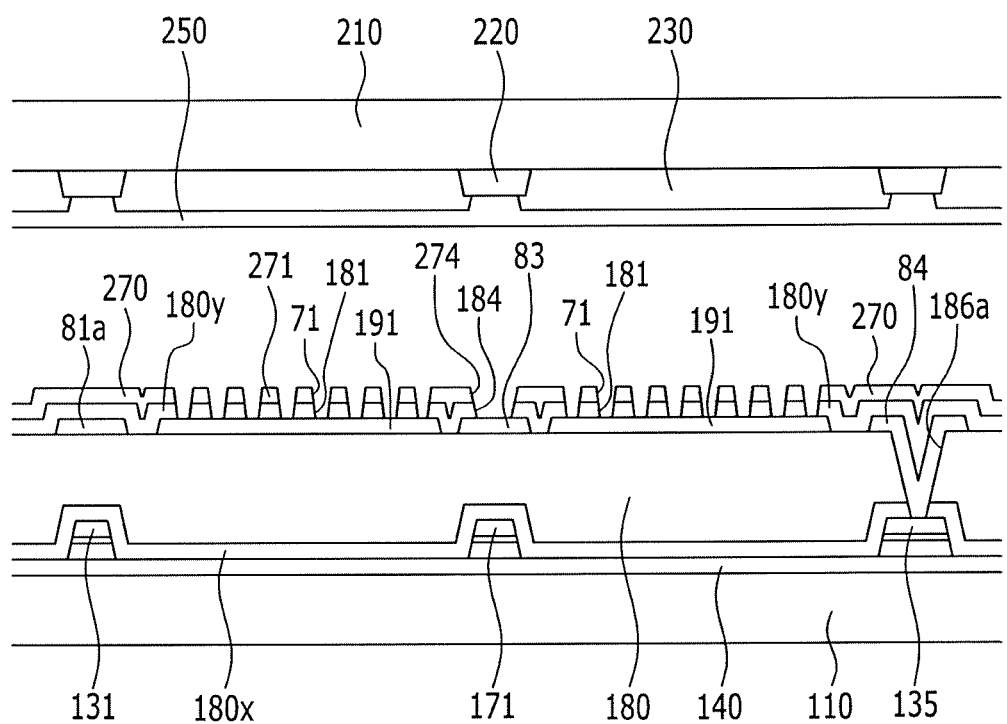
FIG. 29 is a cross-sectional view of the liquid crystal display of FIG. 27 taken along the line XXIX-XXIX.
Figure 30:
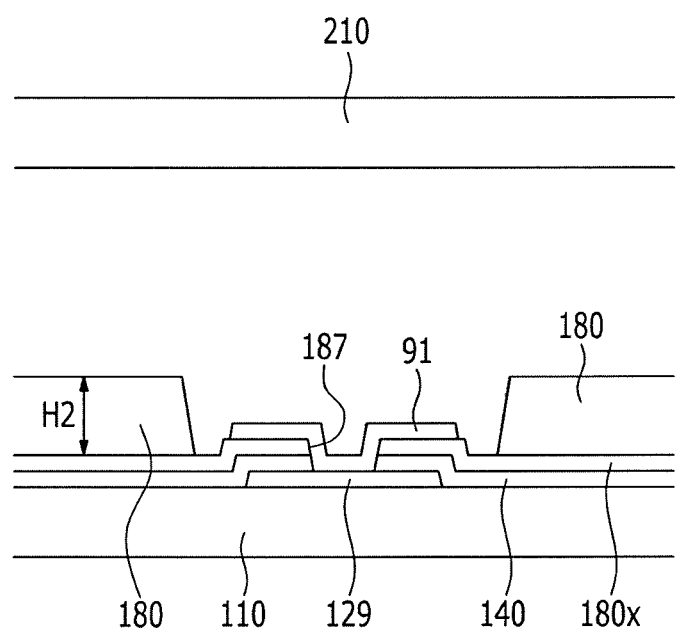
FIG. 30 is a cross-sectional view of the liquid crystal display of FIG. 27 taken along the line XXX-XXX.
Figure 31:
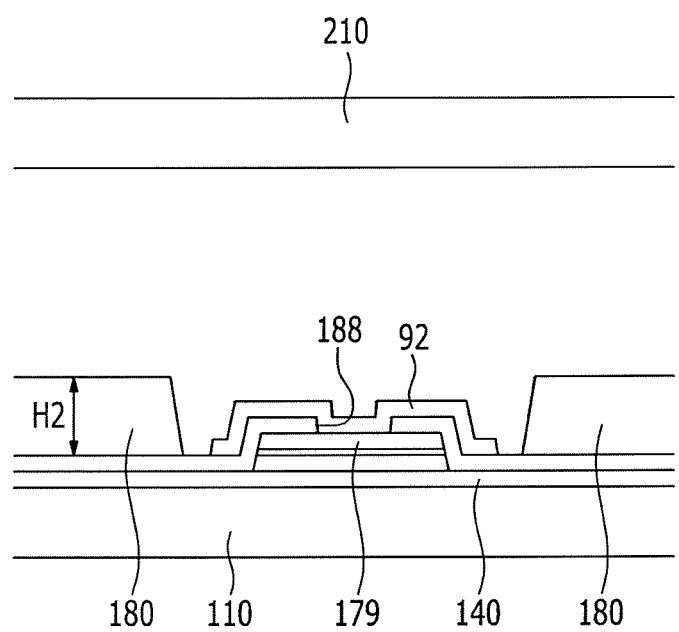
FIG. 31 is a cross-sectional view of the liquid crystal display of FIG. 27 taken along the line XXXI-XXXI.
Figure 32:
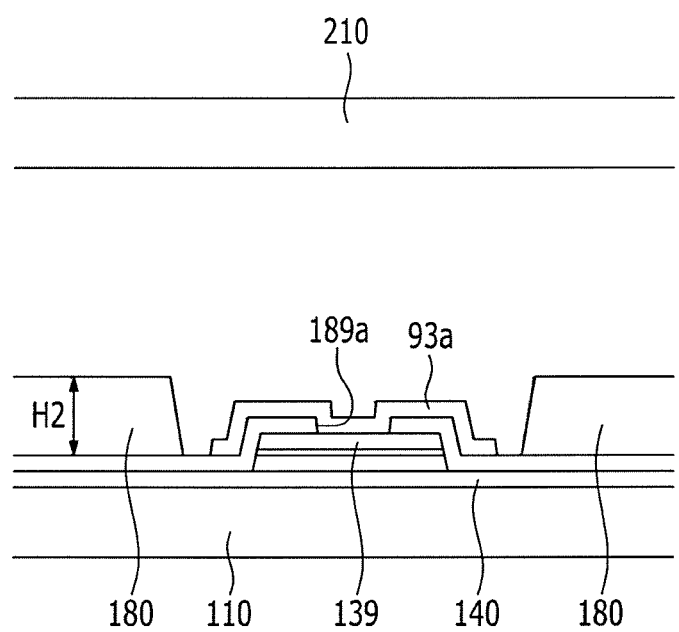
FIG. 32 is a cross-sectional view of the liquid crystal display of FIG. 27 taken along the line XXXII-XXXII.

Next, the liquid crystal display according to another exemplary embodiment of the present disclosure will be described with reference to FIG. 27 to FIG. 32. FIG. 27 is a layout view of a liquid crystal display according to another exemplary embodiment of the present disclosure. FIG. 28 is a cross-sectional view of the liquid crystal display of FIG. 27 taken along the line XXVIII-XXVIII. FIG. 29 is a cross-sectional view of the liquid crystal display of FIG. 27 taken along the line XXIX-XXIX. FIG. 30 is a cross-sectional view of the liquid crystal display of FIG. 27 taken along the line XXX-XXX. FIG. 31 is a cross-sectional view of the liquid crystal display of FIG. 27 taken along the line XXXI-XXXI. FIG. 32 is a cross-sectional view of the liquid crystal display of FIG. 27 taken along the line XXXII-XXXII.

Referring to FIG. 27 to FIG. 32, a liquid crystal display according to a present exemplary embodiment is similar to a liquid crystal display according to an exemplary embodiment of FIG. 18 to FIG. 23. The description of the same constituent elements is omitted.

Referring to FIG. 27 to FIG. 32, a liquid crystal display according to an exemplary embodiment of the present disclosure includes a lower panel 100 and an upper panel 200 facing each other, and a liquid crystal layer 3 interposed therebetween.

First, the lower panel 100 will be described.

A plurality of first and second gate lines 121a and 121b are disposed on a first insulation substrate 110. The first gate line 121a and the second gate line 121b are disposed in pairs between pixel rows.

The first gate line 121a includes a first gate electrode 124a, and the second gate line 121b includes a second gate electrode 124b. Each of the gate lines 121a and 121b includes a wide gate pad portion 129 for connection with another layer or an external driving circuit.

A gate insulating layer 140 is disposed on the plurality of gate lines 121a and 121b.

A first semiconductor 154a and a second semiconductor 154b are disposed on the gate insulating layer 140.

Ohmic contacts 163a and 165a are disposed on the semiconductors 154a and 154b.

A plurality of data lines 171, a plurality of drain electrodes 175a and 175b, and a plurality of compensation voltage lines 131 are disposed on the ohmic contacts 163a and 165a.

The data line 171 transmits a data signal and extends in a substantially longitudinal direction thereby intersecting the gate lines 121a and 121b. Each data line 171 is associated with two columns of the pixels.

Each data line 171 includes a first source electrode 173a that extends toward the first gate electrode 124a and a second source electrode 173b that extends toward the second gate electrode 124b.

Each data line 171 includes a wide data pad portion 179 for connection with another layer or an external driving circuit.

The first drain electrode 175a faces the first source electrode 173a and forms a thin film transistor (TFT) along with the first gate electrode 124a and the first semiconductor 154a, and the second drain electrode 175b faces the second source electrode 173b and forms a thin film transistor (TFT) along with the second gate electrode 124b and the second semiconductor 154b.

The compensation voltage line 131 extends parallel to the data line 171 and each may be associated with two pixel columns. The data line 171 and the compensation voltage line 131 may be alternately disposed.

The compensation voltage line 131 includes a plurality of extensions 135 and a wide compensation pad portion 139 for connection with another layer or an external driving circuit.

A first passivation layer 180x is disposed on a plurality of data lines 171, a plurality of drain electrode 175a and 175b, and a plurality of compensation voltage line 131.

An organic layer 180 is disposed on the first passivation layer 180x. The organic layer 180 may be thicker than the first passivation layer 180x and have a flat surface.

The organic layer 180 may be positioned in the display area in which a plurality of pixels are positioned, and may not be positioned in a peripheral area in which the gate pad portion 129, the data pad portion 179, and the compensation pad portion 139 are positioned.

The organic layer 180 and the first passivation layer 180x have a first contact hole 185a that exposes the first drain electrode 175a, a second contact hole 185b that exposes the second drain electrode 175b, and a third contact hole 186a that exposes the extension 135 of the compensation voltage line 131.

The first passivation layer 180x and the gate insulating layer 140 have a fourth contact hole 187 at a region positioned at the gate pad portion 129 where they do not overlap the organic layer 180 that exposes the gate pad portion 129. Similarly, the first passivation layer 180x has a fifth contact hole 188 at a region positioned at the data pad portion 179 where it does not overlap the organic layer 180 that exposes the data pad portion 179, and the first passivation layer 180x has a sixth contact hole 189a at a region positioned at the compensation pad portion 139 where it does not overlap the organic layer 180 that exposes the compensation pad portion 139.

A pixel electrode 191 and a compensation electrode 80 are disposed on the organic layer 180.

The pixel electrode 191 is positioned at both sides of the data line 171, and is connected to the first drain electrode 175a through the first contact hole 185a and the second drain electrode 175b through the second contact hole 185b.

The compensation electrode 80 includes a first longitudinal portion 81a, a second longitudinal portion 81b, a first transverse portion 82a, a second transverse portion 82b, and a shielding electrode 83. The first longitudinal portion 81a and the second longitudinal portion 81b overlap and extend parallel to two compensation voltage lines 131 positioned at both sides of the data line 171. The first transverse portion 82a extends from the first longitudinal portion 81a parallel to the direction of the gate lines 121a and 121b, and the second transverse portion 82b extends from the second longitudinal portion 81b parallel to the direction of the gate lines 121a and 121b. The shielding electrode 83 is connected to the first transverse portion 82a and the second transverse portion 82b, and overlaps and is parallel to the data line 171.

The first longitudinal portion 81a and the second longitudinal portion 81b of the compensation electrode 80 include a plurality of first connections 84 that overlap the extension 135 of the compensation voltage line 131.

The first connection 84 of the compensation electrode 80 is connected to the compensation voltage line 131 through the third contact hole 186a.

The pixel electrode 191 and the compensation electrode 80 may be simultaneously formed from the same layer.

A second passivation layer 180y is disposed on the pixel electrode 191 and the compensation electrode 80, and a common electrode 270, a first contact assistant 91, a second contact assistant 92, and a third contact assistant 93a are disposed on the second passivation layer 180y.

The first contact assistant 91 is positioned on the gate pad portion 129 exposed through the fourth contact hole 187, the second contact assistant 92 is positioned on the data pad portion 179 exposed through the fifth contact hole 188, and the third contact assistant 93a is positioned on the compensation pad portion 139 exposed through the sixth contact hole 189a.

The second passivation layer 180y and the common electrode 270 positioned on the second passivation layer 180y have substantially the same planar shape.

The second passivation layer 180y and the common electrode 270 are positioned in the display area where a plurality of pixels are positioned, but are not positioned in the peripheral area where the gate pad portion 129 and the data pad portion 179 are positioned.

The common electrode 270 has a plurality of first cutouts 71, and the second passivation layer 180y has a plurality of third cutouts 181.

Different from a liquid crystal display according to an exemplary embodiment described with reference to FIG. 18 to FIG. 23, the common electrode 270 of a liquid crystal display according to a present exemplary embodiment further includes a second cutout 274 at a region overlapping the data line 171, and the second passivation layer 180y further includes a fourth cutout 184 at a region overlapping the data line 171.

The first cutout 71 of the common electrode 270 and the third cutout 181 of the second passivation layer 180y have substantially the same planar shape, and the second cutout 274 of the common electrode 270 and the fourth cutout 184 of the second passivation layer 180y have substantially the same planar shape. An edge of the first cutout 71 overlaps an edge of the third cutout 181, and an edge of the second cutout 274 overlaps an edge of the fourth cutout 184. Therefore, the second passivation layer 180y and the common electrode 270 may be formed together using one photomask.

Now, the upper display panel 200 will be described.

A light blocking member 220 and a color filter 230 are disposed on the second insulation substrate 210, and an overcoat 250 is disposed on the color filter 230 and the light blocking member 220.

The liquid crystal layer 3 includes a plurality of liquid crystal molecules positioned on the pixel electrode 191 and the common electrode 270, and are arranged such that long axis direction thereof is aligned parallel to the display panels 100 and 200.

The pixel electrode 191 receives a data voltage from the drain electrodes 175a and 175b, and the common electrode 270 receives a common voltage having a predetermined magnitude from a common voltage applying unit which is disposed outside the display region.

The pixel electrode 191 and the common electrode 270 are the field generating electrodes that generate an electric field that rotates the liquid crystal molecules of the liquid crystal layer 3 in a direction parallel with a direction of the electric field. The polarization of light passing through the liquid crystal layer 3 changes due to the rotation direction of the liquid crystal molecules as described above.

In a liquid crystal display according to a present exemplary embodiment, the organic layer 180 is positioned on the first passivation layer 180x of the lower panel 100, and the color filter 230 and the light blocking member 220 are positioned on the upper panel 200. However, in a liquid crystal display according to another exemplary embodiment of the present disclosure, the color filter 230 may replace the organic layer 180 on the lower panel 100 and the color filter 230 may be omitted from the upper panel 200. In this case, the light blocking member 220 may also be positioned on the lower panel 100 instead of the upper panel 200.

As described with reference to FIG. 7, according to a liquid crystal display according to a present exemplary embodiment, to compensate common voltage ripple generated by the coupling of the voltage applied to the data line 171 and the common electrode 270, the voltage having a polarity opposite to the ripple voltage is applied to the compensation electrode 80 to prevent the ripple due to the coupling between the data line 171 and the common electrode 270.

Also, in a liquid crystal display according to a present exemplary embodiment, the common electrode 270 has a second cutout 274 in the region overlapping the data line 171, which may reduce the overlap area between the data line 171 and the common electrode 270. Accordingly, reducing the coupling between the data line 171 and the common electrode 270 may further prevent a common voltage ripple generated by the coupling between the data line 171 and the common electrode 270.

Many characteristics of liquid crystal displays according to exemplary embodiments described with reference to FIG. 1 to FIG. 6, FIG. 9 to FIG. 11, FIG. 12 to FIG. 17, and FIG. 18 to FIG. 23 may be applied to a liquid crystal display of the present exemplary embodiment.

Figure 33:
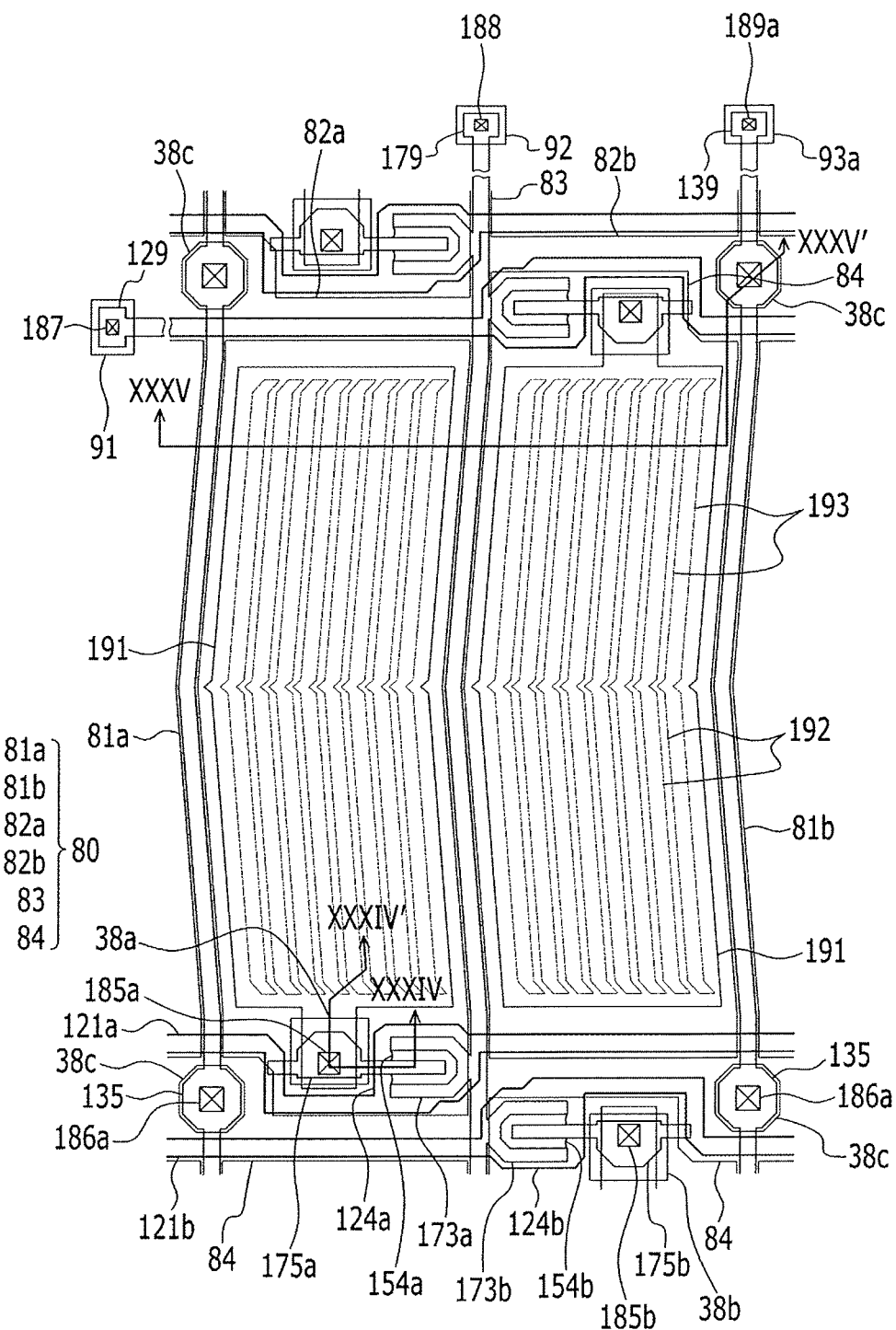
FIG. 33 is a layout view of a liquid crystal display according to another exemplary embodiment of the present disclosure.
Figure 34:
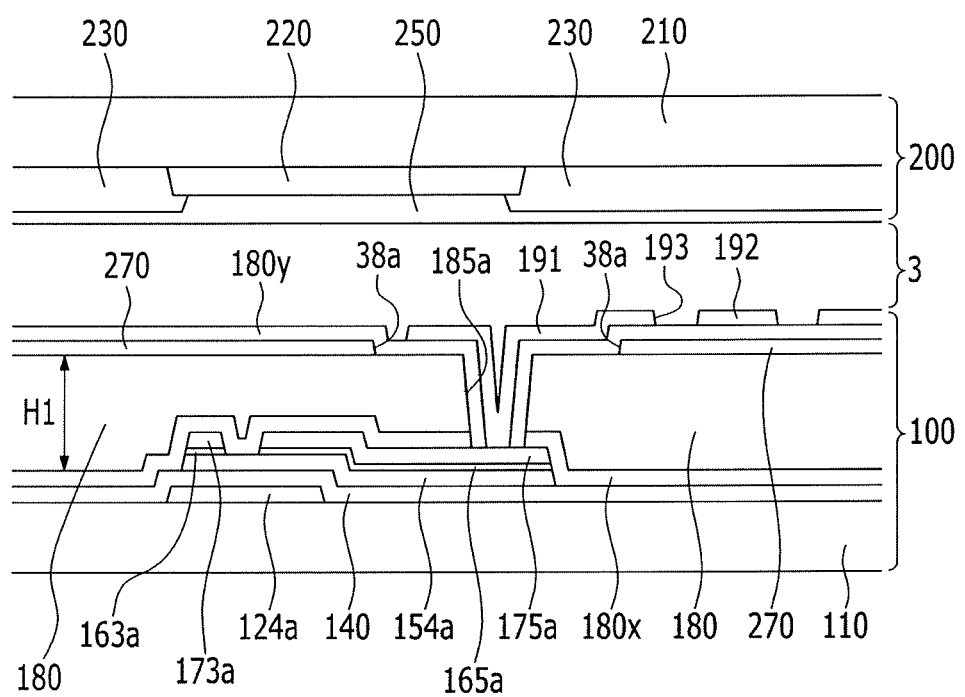
FIG. 34 is a cross-sectional view of the liquid crystal display of FIG. 33 taken along the line XXXIV-XXXIV'.
Figure 35:
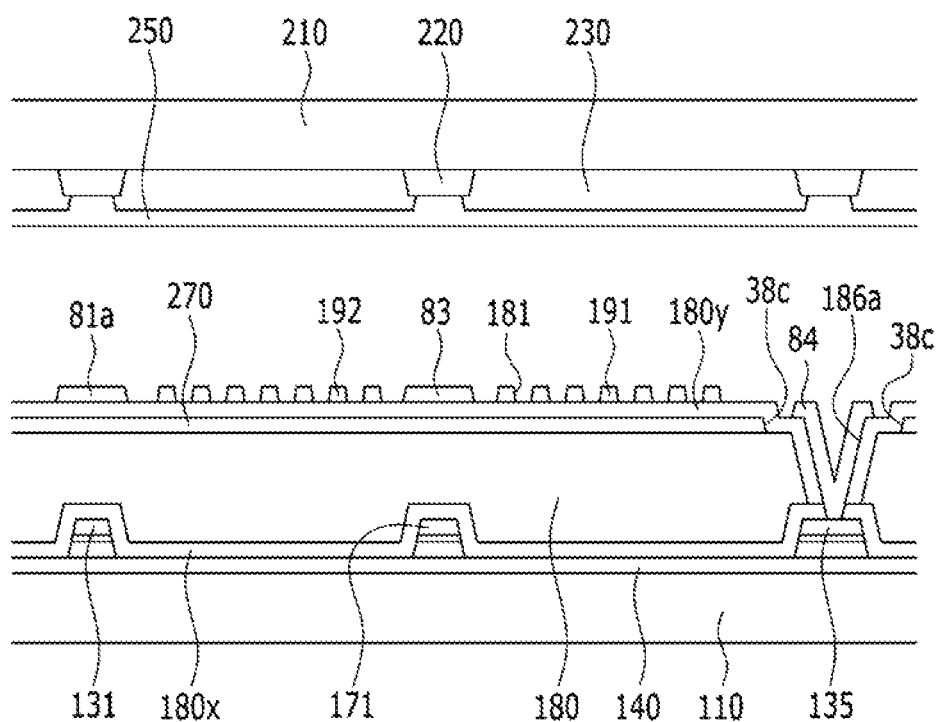
FIG. 35 is a cross-sectional view of the liquid crystal display of FIG. 33 taken along the line XXXV-XXXV'.

Next, a liquid crystal display according to an exemplary embodiment of the present disclosure will be described with reference to FIG. 33 to FIG. 35. FIG. 33 is a layout view of a liquid crystal display according to another exemplary embodiment of the present disclosure. FIG. 34 is a cross-sectional view of the liquid crystal display of FIG. 33 taken along the line XXXIV-XXXIV'. FIG. 35 is a cross-sectional view of the liquid crystal display of FIG. 33 taken along the line XXXV-XXXV'.

Referring to FIG. 33 to FIG. 35, a liquid crystal display according to an exemplary embodiment of the present disclosure includes a lower panel 100 and an upper panel 200 facing each other, and a liquid crystal layer 3 interposed therebetween.

First, the lower panel 100 will be described.

A plurality of first and second gate lines 121a and 121b are disposed on a first insulation substrate 110 made of a transparent glass or plastic.

The first gate line 121a and the second gate line 121b are disposed in pairs between pixel rows.

The first gate line 121a includes a first gate electrode 124a, and the second gate line 121b includes a second gate electrode 124b. Each of the gate lines 121a and 121b includes a wide gate pad portion 129 for connection with another layer or an external driving circuit.

A gate insulating layer 140 is disposed on the plurality of gate lines 121a and 121b.

A first semiconductor 154a and a second semiconductor 154b are disposed on the gate insulating layer 140. The semiconductors 154a and 154b may include an oxide semiconductor.

Ohmic contacts 163a and 165a are disposed on the semiconductors 154a and 154b. If the semiconductors 154a and 154b include an oxide semiconductor, the ohmic contacts 163a and 165a may be omitted.

A plurality of data lines 171, a plurality of drain electrodes 175a and 175b, and a plurality of compensation voltage lines 131 are disposed on the ohmic contacts 163a and 165a.

The data line 171 transmits a data signal and extends in a substantially longitudinal direction thereby intersecting the gate lines 121a and 121b. Each data line 171 is associated with two columns of pixels.

The data line 171 may have a first curved portion with a curved shape to acquire maximize transmittance of the liquid crystal display, and the first curved portion may meet a second curved portion which forms a predetermined angle with the first curved portion at a "V" shape in a middle region of the pixel area.

Each data line 171 includes a first source electrode 173a that extends toward the first gate electrode 124a and a second source electrode 173b that extends toward the second gate electrode 124b.

Each data line 171 includes a wide data pad portion 179 for connection with another layer or an external driving circuit.

The first drain electrode 175a includes one end that faces the first source electrode 173a and a wide other end, and forms a thin film transistor (TFT) along with the first gate electrode 124a and the first semiconductor 154a.

The second drain electrode 175b includes one end that faces the second source electrode 173b and a wide other end, and forms a thin film transistor (TFT) along with the second gate electrode 124b and the second semiconductor 154b.

The compensation voltage line 131 extends parallel to the data line 171 and each may be associated with two pixel columns. The data line 171 and the compensation voltage line 131 may be alternately disposed.

The compensation voltage line 131 includes a plurality of extensions 135, and includes a wide compensation pad portion 139 for connection with another layer or an external driving circuit.

A first passivation layer 180x is disposed on the plurality of data lines 171, the plurality of drain electrodes 175a and 175b, and the plurality of compensation voltage lines 131. The first passivation layer 180x may be made of an organic insulating material or an inorganic insulating material.

An organic layer 180 is disposed on the first passivation layer 180x. The organic layer 180 may be thicker than the first passivation layer 180x, and have a flat surface.

In a liquid crystal display according to another exemplary embodiment of the present disclosure, the organic layer 180 may be omitted. In a liquid crystal display according to another exemplary embodiment of the present disclosure, the organic layer 180 may be a color filter, and in this case, a layer disposed on the organic layer 180 may be further included. For example, an overcoat or capping layer may be disposed on the color filter to prevent a color filter pigment from flowing into the liquid crystal layer, and the overcoat may be made of an insulating material such as a silicon nitride (SiNx).

The organic layer 180 may be positioned in the display area in which a plurality of pixels are positioned, and may not be positioned in a peripheral area in which the gate pad portion 129, the data pad portion 179, and the compensation pad portion 139 are positioned.

A first height H1 of the organic layer 180 positioned in the display area is greater than a second height H2 of the organic layer 180 positioned near the gate pad portion 129, the data pad portion 179, and the compensation pad portion 139.

A common electrode 270 is disposed on the organic layer 180.

The common electrode 270 is disposed on the whole display area and may have a plate-type planar shape, and is connected to a common electrode 270 disposed in an adjacent pixel. A plate type means a planar shape without splitting.

The common electrode 270 includes a sixth cutout 38a at a region that overlaps the first drain electrode 175a, a seventh cutout 38b at a region that overlaps the second drain electrode 175b, and an eighth cutout 38c at a region that overlaps the extension 135 of the compensation voltage line 131.

A second passivation layer 180y is disposed on the common electrode 270.

The second passivation layer 180y, the organic layer 180, and the first passivation layer 180x have a first contact hole 185a that exposes the first drain electrode 175a, a second contact hole 185b that exposes the second drain electrode 175b, and a third contact hole 186a that exposes the extension 135 of the compensation voltage line 131. The first contact hole 185a is disposed in the sixth cutout 38a of the common electrode 270, the second contact hole 185b is disposed in the seventh cutout 38b of the common electrode 270, and the third contact hole 186a is disposed in the eighth cutout 38c of the common electrode 270.

The second passivation layer 180y, the first passivation layer 180x, and the gate insulating layer 140 have a fourth contact hole 187 in a region positioned at the gate pad portion 129 where they do not overlap the organic layer 180 that exposes the gate pad portion 129. Similarly, the second passivation layer 180y and the first passivation layer 180x have a fifth contact hole 188 in a region positioned at the data pad portion where they do not overlap the organic layer that exposes the data pad portion 179, and the second passivation layer 180y and the first passivation layer 180x have a sixth contact hole 189a in a region positioned at the compensation pad portion 139 where they do not overlap the organic layer 180 that exposes the compensation pad portion 139.

A pixel electrode 191, a compensation electrode 80, a first contact assistant 91, a second contact assistant 92, and a third contact assistant 93a are disposed on the second passivation layer 180y.

The pixel electrode 191 has a plurality of fifth cutouts 193. The pixel electrode 191 includes a plurality of second branch electrodes 192 defined by the plurality of fifth cutouts 193. A plurality of second branch electrodes 192 of the pixel electrode 191 extend substantially parallel to the data line 171 and overlap the common electrode 270.

The pixel electrode 191 is positioned at both sides of the data line 171, and is connected to the first drain electrode 175a through the first contact hole 185a and the second drain electrode 175b through the second contact hole 185b.

The compensation electrode 80 includes a first longitudinal portion 81a, a second longitudinal portion 81b, a first transverse portion 82a, a second transverse portion 82b, and a shielding electrode 83. The first longitudinal portion 81a and the second longitudinal portion 81b extend parallel to and overlap two compensation voltage lines 131 positioned at both sides of the data line 171. The first transverse portion 82a extends from the first longitudinal portion 81a parallel to the direction of the gate lines 121a and 121b, and the second transverse portion 82b extends from the second longitudinal portion 81b parallel to the direction of the gate lines 121a and 121b. The shielding electrode 83 is connected to the first transverse portion 82a and the second transverse portion 82b and is parallel to and overlaps the data line 171.

The first longitudinal portion 81a and the second longitudinal portion 81b of the compensation electrode 80 include a plurality of first connections 84 that overlap the extension 135 of the compensation voltage line 131.

The first connection 84 of the compensation electrode 80 is connected to the compensation voltage line 131 through the third contact hole 186a.

The first contact assistant 91 is positioned on the gate pad portion 129 exposed through the fourth contact hole 187, the second contact assistant 92 is positioned on the data pad portion 179 exposed through the fifth contact hole 188, and the third contact assistant 93a is positioned on the compensation pad portion 139 exposed through the sixth contact hole 189a.

The pixel electrode 191, the compensation electrode 80, the first contact assistant 91, the second contact assistant 92, and the third contact assistant 93a are formed from a transparent conductive layer such as ITO or IZO. The pixel electrode 191, the compensation electrode 80, the first contact assistant 91, the second contact assistant 92, and the third contact assistant 93a may be simultaneously formed from a same layer.

In addition, a horizontal first alignment layer rubbed in a predetermined direction may be applied on the second passivation layer 180y and the pixel electrode 191. However, in a liquid crystal display according to another exemplary embodiment of the present disclosure, the first alignment layer may include a photoreactive material to be photo-aligned.

Now, the upper display panel 200 will be described.

A light blocking member 220 is disposed on a second insulating substrate 210 made of transparent glass, plastic, etc. The light blocking member 220 is also called a black matrix and prevents light leakage.

A plurality of color filters 230 are also disposed on the second substrate 210.

An overcoat 250 is disposed on the color filter 230 and the light blocking member 220. The overcoat 250 is made of an organic insulator, prevents exposure of the color filter 230, and provides a flat surface. The overcoat 250 may be omitted.

In addition, a horizontal second alignment layer rubbed in a predetermined direction may be disposed on the overcoat 250. However, in a liquid crystal display according to another exemplary embodiment of the present disclosure, the second alignment layer may include a photoreactive material to be photo-aligned.

The liquid crystal layer 3 includes a plurality of liquid crystal molecules positioned on the pixel electrode 191 and the common electrode 270 that are arranged such that long axis direction thereof is aligned parallel to the display panels 100 and 200.

The pixel electrode 191 receives a data voltage from the drain electrodes 175a and 175b and the common electrode 270 receives a common voltage having a predetermined magnitude from a common voltage applying unit which is disposed outside the display region.

The pixel electrode 191 and the common electrode 270 are field generating electrodes that generate an electric field that rotates the liquid crystal molecules of the liquid crystal layer 3 in a direction parallel with a direction of the electric field. The polarization of light passing through the liquid crystal layer 3 changes due to the rotation direction of the liquid crystal molecules as described above.

In a liquid crystal display according to a present exemplary embodiment, the organic layer 180 is positioned on the first passivation layer 180x of the lower panel 100, and the color filter 230 and the light blocking member 220 are positioned on the upper panel 200. However, in a liquid crystal display according to another exemplary embodiment of the present disclosure, the color filter 230 may replace the organic layer 180 on the lower panel 100 and the color filter 230 may be omitted from the upper panel 200. In this case, the light blocking member 220 may also be positioned on the lower panel 100 instead of the upper panel 200.

In a liquid crystal display according to the present exemplary embodiment, different from liquid crystal displays according to exemplary embodiments described with reference to FIG. 1 to FIG. 6 and FIG. 8 to FIG. 32, the common electrode 270 has a planar shape, the second passivation layer 180y is an insulating layer disposed on the common electrode 270, the pixel electrode 191 has a plurality of second branch electrodes 192, and a plurality of second branch electrodes 192 of the pixel electrode 191 overlap the common electrode 270.

As described with reference to FIG. 7, according to a liquid crystal display according to a present exemplary embodiment, to compensate a common voltage ripple generated by the coupling of the voltage applied to the data line 171 and the common electrode 270, a voltage having a polarity opposite to the common voltage ripple is applied to the compensation electrode 80 to prevent the ripple due to the coupling between the data line 171 and the common electrode 270.

The shielding electrode 83 of the compensation electrode 80 of the liquid crystal display according to the present exemplary embodiment may overlap some or all of the data lines 171.

Many characteristics of liquid crystal displays according to previously described exemplary embodiments may be applied to a liquid crystal display of a present exemplary embodiment.

Figure 36:
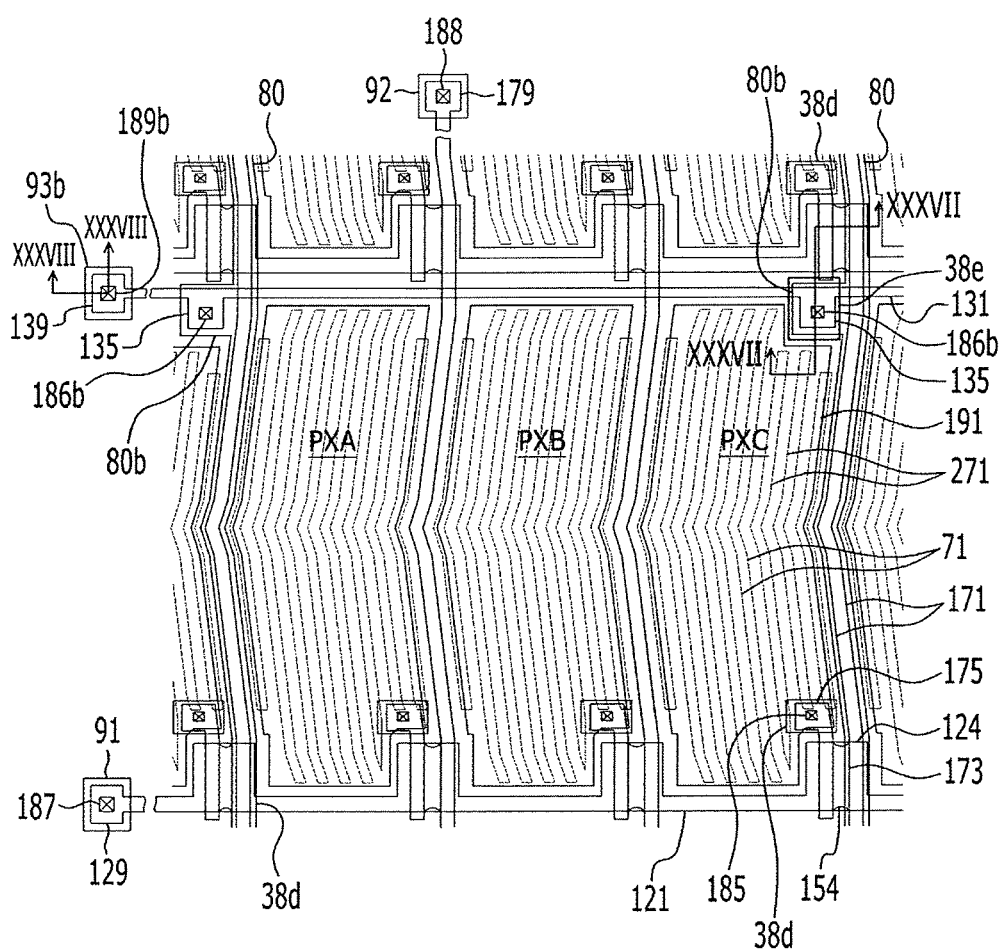
FIG. 36 is a layout view of a liquid crystal display according to another exemplary embodiment of the present disclosure.
Figure 37:
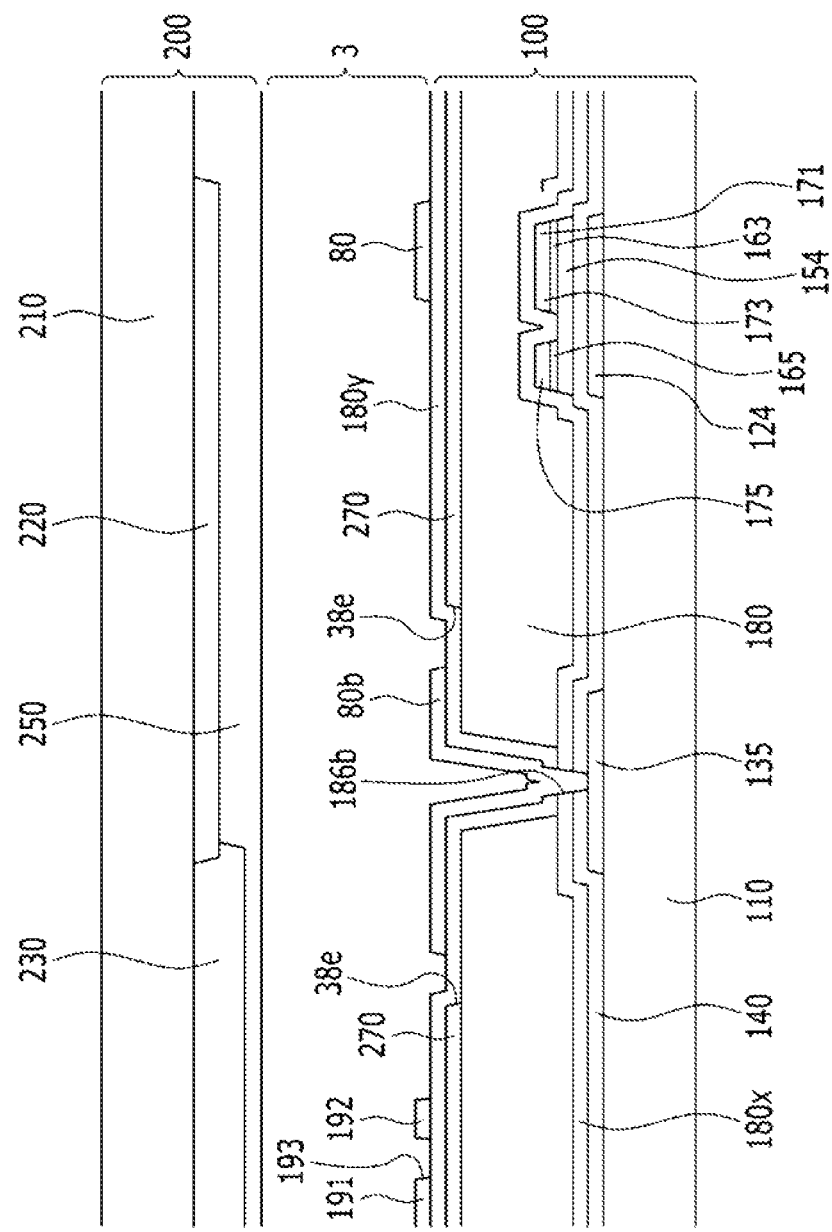
FIG. 37 is a cross-sectional view of the liquid crystal display of FIG. 36 taken along the line XXXVII-XXXVII.
Figure 38:
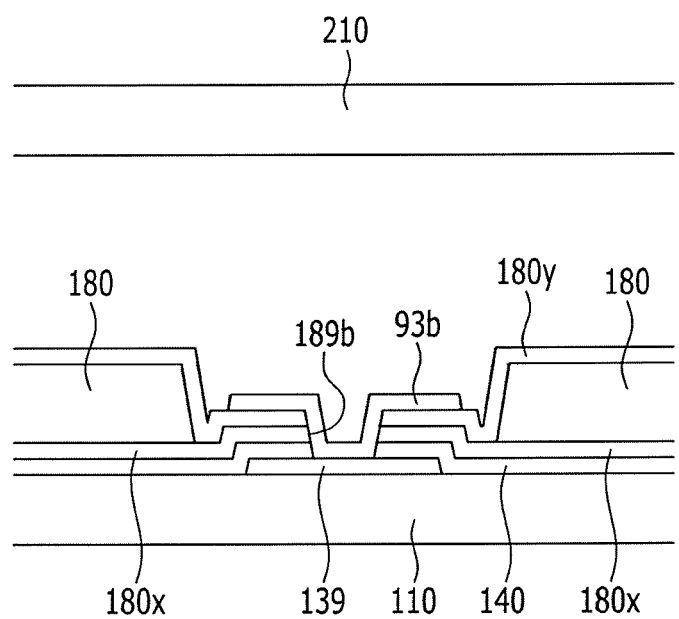
FIG. 38 is a cross-sectional view of the liquid crystal display of FIG. 36 taken along the line XXXVIII-XXXVIII.

Next, a liquid crystal display according to another exemplary embodiment of the present disclosure will be described with reference to FIG. 36 to FIG. 38. FIG. 36 is a layout view of a liquid crystal display according to another exemplary embodiment of the present disclosure. FIG. 37 is a cross-sectional view of the liquid crystal display of FIG. 36 taken along the line XXXVII-XXXVII. FIG. 38 is a cross-sectional view of the liquid crystal display of FIG. 36 taken along the line XXXVIII-XXXVIII.

Referring to FIG. 36 to FIG. 38, a liquid crystal display according to an exemplary embodiment of the present disclosure includes a lower panel 100 and an upper panel 200 facing each other, and a liquid crystal layer 3 interposed therebetween.

First, the lower panel 100 will be described.

A gate line 121 and a compensation voltage line 131 are disposed on a first insulation substrate 110 made of transparent glass or plastic. The gate line 121 and the compensation voltage line 131 are formed together from a same layer.

The gate line 121 includes a gate electrode 124 and the gate pad portion 129.

The compensation voltage line 131 extends parallel to the gate line 121, and includes a plurality of extensions 135 and the compensation pad portion 139.

A gate insulating layer 140 is disposed on the gate line 121 and the compensation voltage line 131.

A semiconductor 154 is disposed on the gate insulating layer 140.

Ohmic contacts 163 and 165 are disposed on the semiconductor 154. The ohmic contacts 163 and 165 may be disposed as a pair on the semiconductor 154. If the semiconductor 154 is an oxide semiconductor, the ohmic contacts 163 and 165 may be omitted.

A data conductor that includes a data line 171, a source electrode 173 and a drain electrode 175 is disposed on the ohmic contacts 163 and 165 and the gate insulating layer 140.

The data line 171 includes a wide end for connection with other layers or an external driving circuit. The data line 171 transmits a data signal and extends in a substantially longitudinal direction thereby intersecting the gate line 121.

In addition, the data line 171 may have a first curved portion with a curved shape to maximize transmittance of the liquid crystal display, and the first curved portions may meet second curved portions which form a predetermined angle with the first curved portions at a center region of the pixel area thereby forming a "V" shape.

The source electrode 173 is a portion of the data line 171, and is positioned on the same line as the data line 171. The drain electrode 175 may be parallel to the source electrode 173. Accordingly, the drain electrode 175 is parallel to the data line 171.

The gate electrode 124, the source electrode 173, and the drain electrode 175 form a thin film transistor (TFT) along with the semiconductor 154, and a channel of the thin film transistor forms in the semiconductor 154 between the source electrode 173 and the drain electrode 175.

A liquid crystal display according to a present exemplary embodiment includes the source electrode 173 positioned on the same line as the data line 171 and the drain electrode 175 extending parallel to the data line 171 such that a width of the thin film transistor may increase without increasing an area occupied by the data conductor, thereby increasing an aperture ratio of the liquid crystal display.

However, in a liquid crystal display according to another exemplary embodiment of the present disclosure, the source electrode 173 and the drain electrode 175 have different shapes.

A first passivation layer 180x is disposed on the data conductors 171, 173, and 175, the gate insulating layer 140, and the exposed portion of the semiconductor 154. The first passivation layer 180x may be made of an organic insulating material or an inorganic insulating material.

An organic layer 180 is disposed on the first passivation layer 180x. The organic layer 180 is thicker than the first passivation layer 180x and may have a flat surface.

The organic layer 180 may be positioned in the display area where a plurality of pixels are positioned, and may not be positioned in the peripheral area where the gate pad portion and the data pad portion are positioned. Alternatively, the organic layer 180 may be positioned in the peripheral area where the gate pad portion or the data pad portion are positioned, and may have a lower surface height than the organic layer 180 positioned in the display area.

A common electrode 270 is disposed on the organic layer 180.

The common electrode 270 is disposed on the whole display area and may have a planar shape, and is connected to a common electrode 270 disposed in an adjacent pixel. The common electrode 270 has a plate-type plane shape without splitting.

The common electrode 270 includes a ninth cutout 38d at a region that overlaps the drain electrode 175 and a tenth cutout 38e at a region that overlaps the extension 135 of the compensation voltage line 131.

A second passivation layer 180y is disposed on the common electrode 270.

The second passivation layer 180y, the organic layer 180, and the first passivation layer 180x have a seventh contact hole 185 that exposes the drain electrode 175.

The organic layer 180, the first passivation layer 180x, and the gate insulating layer 140 have an eighth contact hole 186b that exposes the compensation voltage line 131.

The seventh contact hole 185 is disposed in the ninth cutout 38d of the common electrode 270, and the eighth contact hole 186b is disposed in a tenth cutout 38e of the common electrode 270.

The second passivation layer 180y, the first passivation layer 180x, and the gate insulating layer 140 have a fourth contact hole 187 in a region positioned at the gate pad portion 129 where they do not overlap the organic layer 180 that exposes the gate pad portion 129. Similarly, the second passivation layer 180y, the first passivation layer 180x, and the gate insulating layer 140 have a ninth contact hole 189b in a region positioned at the compensation pad portion 139 where they do not overlap the organic layer 180 that exposes the compensation pad portion 139. The second passivation layer 180y and the first passivation layer have a fifth contact hole 188 in a region positioned at the data pad portion 179 where they do not overlap the organic layer that exposes the data pad portion 179.

A pixel electrode 191, a compensation electrode 80, a first contact assistant 91, a second contact assistant 92, and a fourth contact assistant 93b are disposed on the second passivation layer 180y.

The pixel electrode 191 has a plurality of fifth cutouts 193. The pixel electrode 191 includes a plurality of second branch electrodes 192 defined by a plurality of fifth cutouts 193. The plurality of second branch electrodes 192 extend substantially parallel to the data line 171 and overlap the common electrode 270.

The compensation electrode 80 overlaps and extends along with the data line 171. The compensation elertrode 80 includes a second connection 80b that extends toward the extension 135 of the compensation voltage line 131.

The second connection 80b of the compensation electrode 80 is connected to the compensation voltage line 131 through the eighth contact hole 186b.

The first contact assistant 91 is disposed on the gate pad portion 129 exposed through the fourth contact hole 187, and the second contact assistant 92 is disposed on the data pad portion 179 exposed through the fifth contact hole 188. Also, the fourth contact assistant 93b is disposed on the compensation pad portion 139 exposed through the ninth contact hole 189b.

The pixel electrode 191, the compensation electrode 80, the first contact assistant 91, the second contact assistant 92, and the fourth contact assistant 93b are formed from a transparent conductive layer such as ITO or IZO. The pixel electrode 191, the compensation electrode 80, the first contact assistant 91, the second contact assistant 92, and the fourth contact assistant 93b may be simultaneously formed from a same layer.

Next, the upper panel 200 will be described.

A light blocking member 220 and a color filter 230 are disposed on the second insulation substrate 210, and an overcoat 250 is disposed on the color filter 230 and the light blocking member 220.

According to a liquid crystal display of a present exemplary embodiment, the compensation electrode 80 overlaps some, but not all of the data lines 171. However, according to a liquid crystal display of another exemplary embodiment of the present disclosure, the compensation electrode 80 may overlap all data lines 171.

In a liquid crystal display according to a present exemplary embodiment, the organic layer 180 is positioned on the first passivation layer 180x of the lower panel 100, and the color filter 230 and the light blocking member 220 are positioned on the upper panel 200. However, in a liquid crystal display according to another exemplary embodiment of the present disclosure, the color filter 230 may replace the organic layer 180 on the lower panel 100 and the color filter 230 may be omitted from the upper panel 200. In this case, the light blocking member 220 may also be positioned on the lower panel 100 instead of the upper panel 200.

In a liquid crystal display according to a present exemplary embodiment, different from liquid crystal displays according to exemplary embodiments described with reference to FIG. 1 to FIG. 6 and FIG. 8 to FIG. 32, the common electrode 270 has a planar shape, the second passivation layer 180y is an insulating layer disposed on the common electrode 270, the pixel electrode 191 has a plurality of second branch electrodes 192, and a plurality of second branch electrodes 192 of the pixel electrode 191 overlap the common electrode 270.

As described with reference to FIG. 7, according to a liquid crystal display according to a present exemplary embodiment, to compensate a common voltage ripple generated by the coupling of the voltage applied to the data line 171 and the common electrode 270, a voltage having an opposite polarity to the common voltage ripple is applied to the compensation electrode 80 to prevent the ripple due to the coupling between the data line 171 and the common electrode 270.

Many characteristics of liquid crystal displays according to previously described exemplary embodiments may be applied to a liquid crystal display of a present exemplary embodiment.

Figure 39:
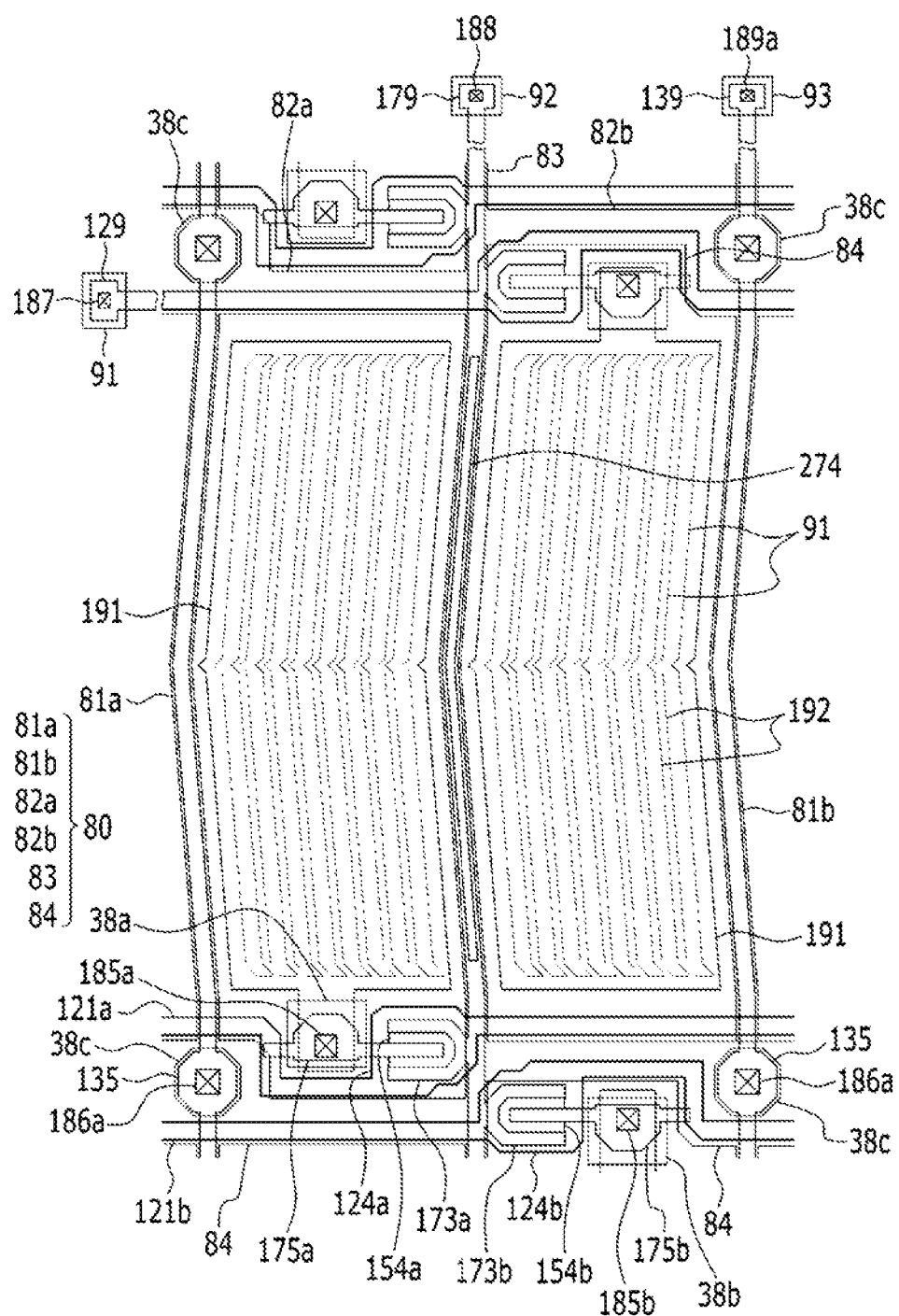
FIG. 39 is a layout view of a liquid crystal display according to another exemplary embodiment of the present disclosure.

Next, a liquid crystal display according to another exemplary embodiment of the present disclosure will be described with reference to FIG. 39. FIG. 39 is a layout view of a liquid crystal display according to another exemplary embodiment of the present disclosure.

Referring to FIG. 39, a liquid crystal display according to a present exemplary embodiment is similar to a liquid crystal display according to an exemplary embodiment described with reference to FIG. 33 to FIG. 35. The description of the same constituent elements is omitted.

Referring to FIG. 39, different from an exemplary embodiment shown in FIG. 33 to FIG. 35, the common electrode 270 of the liquid crystal display according to a present exemplary embodiment further includes a second cutout 274 at the region overlapping the data line 171.

The common electrode 270 further includes the second cutout 274 at the region overlapping the data line 171 to reduce the overlap area between the data line 171 and the common electrode 270. Accordingly, the coupling between the data line 171 and the common electrode 270 may be reduced to prevent a common voltage ripple generated by the coupling between the data line 171 and the common electrode 270.

Many features of a liquid crystal display according to previously described exemplary embodiments may be applied to a liquid crystal display according to a present exemplary embodiment.

As described above, according to a liquid crystal display according to an exemplary embodiment of the present disclosure, when forming two field generating electrodes on one display pane, manufacturing cost may be reduced while preventing a common voltage ripple generated by the coupling between the data line and the common electrode.

While this disclosure has been described in connection with what is presently considered to be practical exemplary embodiments, it is to be understood that the disclosure is not limited to the disclosed embodiments, but, on the contrary, is intended to cover various modifications and equivalent arrangements included within the spirit and scope of the appended claims.

What is claimed is:

1. A liquid crystal display comprising:
a gate line, a data line, and a compensation voltage line disposed on an insulation substrate;
a first passivation layer disposed on the gate line, the data line, and the compensation voltage line;
a pixel electrode connected to the gate line and the data line, and a compensation electrode connected to the compensation voltage line, disposed on the first passivation layer; and
a common electrode disposed on the first passivation layer,
wherein the compensation electrode is disposed on a same layer with the pixel electrode,
wherein the compensation voltage line is formed from a same layer as the data line,
wherein the compensation voltage line supplies a compensation voltage to the compensation electrode and the data line supplies a data voltage to the pixel electrode,
wherein the compensation electrode comprises a first portion that overlaps the data line, a second portion that overlaps the compensation voltage line and is spaced from the first portion, and a transversal portion that overlaps the gate line and connects the first portion and the second portion,
wherein the transversal portion is wider than a width of the gate line,
wherein the transversal portion is disposed between the first portion and the second portion,
wherein the gate line is one of a plurality of gate lines and the pixel electrode is included in a plurality of rows of pixel electrodes
wherein two gate lines are located between each row of pixel electrodes, a contact hole is located between the two gate lines, and the compensation electrode connects to the compensation voltage line through the contact hole, and
wherein a polarity of the compensation voltage is opposite to a polarity of the data voltage.

2. The liquid crystal display of claim 1, wherein
the data line includes a plurality of data lines, and
the compensation electrode overlaps at least some of the plurality of data lines.

3. The liquid crystal display of claim 2, wherein
the common electrode overlaps the data line, and
the common electrode overlaps the compensation electrode.

4. The liquid crystal display of claim 3, wherein
the common electrode has a cutout formed at a position that overlaps the data line.

5. The liquid crystal display of claim 3, further comprising
a second passivation layer disposed on the pixel electrode and the compensation electrode, and under the common electrode, and
an organic layer disposed between the first passivation layer and the second passivation layer.

6. The liquid crystal display of claim 5, wherein
the common electrode has a first cutout,
the second passivation layer has a second cutout, and
an edge of the first cutout overlaps an edge of the second cutout.

7. The liquid crystal display of claim 2, further comprising
a second passivation layer disposed on the common electrode and under the pixel electrode and the compensation electrode.

8. The liquid crystal display of claim 1, wherein
the data line includes a plurality of data lines, and
the compensation electrode overlaps at least some of the plurality of data lines.

9. The liquid crystal display of claim 8, wherein
the common electrode overlaps the data line, and
the common electrode overlaps the compensation electrode.

10. The liquid crystal display of claim 9, wherein
the common electrode has a cutout formed at a position that overlaps the data line.

11. The liquid crystal display of claim 9, further comprising
a second passivation layer disposed on the pixel electrode and the compensation electrode, and under the common electrode, and
an organic layer disposed between the first passivation layer and the second passivation layer.

12. The liquid crystal display of claim 11, wherein
the common electrode has a first cutout,
the second passivation layer has a second cutout, and
an edge of the first cutout overlaps an edge of the second cutout.

13. The liquid crystal display of claim 9, further comprising
a second passivation layer disposed on the common electrode and under the pixel electrode and the compensation electrode.

14. The liquid crystal display of claim 1, wherein
the common electrode overlaps the data line, and
the common electrode overlaps the compensation electrode.

15. The liquid crystal display of claim 14, wherein
the common electrode has a cutout formed at a position that overlaps the data line.

16. The liquid crystal display of claim 14, further comprising
a second passivation layer disposed on the pixel electrode and the compensation electrode, and under the common electrode, and
an organic layer disposed between the first passivation layer and the second passivation layer.

17. The liquid crystal display of claim 1, wherein
the compensation voltage line extends parallel to the data line.

18. The liquid crystal display of claim 17, wherein
the compensation voltage line is positioned between two adjacent data lines.

* * * * *